United States Patent
Tang

(10) Patent No.: US 12,543,304 B2
(45) Date of Patent: Feb. 3, 2026

(54) SEMICONDUCTOR STRUCTURE, METHOD FOR FORMING SAME AND LAYOUT STRUCTURE

(71) Applicant: CHANGXIN MEMORY TECHNOLOGIES, INC., Hefei (CN)

(72) Inventor: Yi Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 681 days.

(21) Appl. No.: 17/954,480

(22) Filed: Sep. 28, 2022

(65) Prior Publication Data
US 2023/0018639 A1   Jan. 19, 2023

Related U.S. Application Data

(63) Continuation of application No. PCT/CN2022/105094, filed on Jul. 12, 2022.

(30) Foreign Application Priority Data

Jun. 24, 2022   (CN) .......................... 202210730342.3

(51) Int. Cl.
*H01L 21/02* (2006.01)
*H10B 12/00* (2023.01)

(52) U.S. Cl.
CPC ............. *H10B 12/30* (2023.02); *H10B 12/03* (2023.02); *H10B 12/05* (2023.02); *H10B 12/482* (2023.02)

(58) Field of Classification Search
CPC ........ H10B 12/30; H10B 12/03; H10B 12/05; H10B 12/482; H10B 12/00; H10B 12/488;
(Continued)

(56) References Cited

U.S. PATENT DOCUMENTS 11,227,864 B1   1/2022 Saeedi Vahdat
2018/0047741 A1*  2/2018 Kuge ..................... H10B 41/27
(Continued)

FOREIGN PATENT DOCUMENTS

CN   112331663 A   2/2021
CN   113130494 A   7/2021
(Continued)

OTHER PUBLICATIONS

Japanese Patent Office, Office Action Issued in Application No. 2023-538010, Aug. 20, 2024, 5 pages.

*Primary Examiner* — Samuel Park
(74) *Attorney, Agent, or Firm* — Kilpatrick Townsend & Stockton LLP

(57) ABSTRACT

A method for forming a semiconductor structure comprises: providing a substrate, which includes a first area and a second area arranged in sequence in a second direction, the first area including active layers arranged at intervals in a third direction; forming an initial gate structure located on a surface of each active layer in the first area; etching the initial gate structures to form comb-shaped gate structures stacked in a third direction, each comb-shaped gate structure including first gate structures arranged at intervals in the first direction; and forming bit line structures extending in the third direction and capacitor structures extending in the second direction in the second area, the bit line structures and the capacitor structures are connecting to the first gate structures.

20 Claims, 30 Drawing Sheets

(58) Field of Classification Search
CPC ........ H01L 21/28; H10D 64/27; H10D 89/00; H10D 64/517
See application file for complete search history.

(56) References Cited

U.S. PATENT DOCUMENTS

| | | |
|---|---|---|
| 2021/0043629 A1 | 2/2021 | Kim et al. |
| 2021/0183861 A1 | 6/2021 | Lee et al. |
| 2021/0183862 A1 | 6/2021 | Son et al. |
| 2021/0202488 A1 | 7/2021 | Choi |
| 2021/0257370 A1 | 8/2021 | Son |
| 2022/0013524 A1 | 1/2022 | Ryu et al. |
| 2022/0045062 A1 | 2/2022 | Saeedi Vahdat et al. |
| 2022/0068929 A1 | 3/2022 | Karda et al. |
| 2022/0085023 A1* | 3/2022 | Shin ................ H10B 12/03 |
| 2022/0102394 A1 | 3/2022 | Liu et al. |
| 2022/0130831 A1 | 4/2022 | Lee et al. |
| 2022/0285355 A1 | 9/2022 | Manfrini et al. |
| 2022/0352171 A1 | 11/2022 | Lee et al. |
| 2022/0375941 A1* | 11/2022 | Lee ................ H10B 12/30 |

FOREIGN PATENT DOCUMENTS

| | | |
|---|---|---|
| CN | 113284898 A | 8/2021 |
| CN | 113644066 A | 11/2021 |
| CN | 113903741 A | 1/2022 |
| CN | 114068425 A | 2/2022 |
| CN | 114121814 A | 3/2022 |
| CN | 114121820 A | 3/2022 |
| CN | 114334836 A | 4/2022 |
| JP | 2016009788 A | 1/2016 |
| JP | 2020141129 A | 9/2020 |

* cited by examiner

SEMICONDUCTOR STRUCTURE, METHOD FOR FORMING SAME AND LAYOUT STRUCTURE

CROSS-REFERENCE TO RELATED APPLICATIONS

This application is a continuation application of International Application No. PCT/CN2022/105094, filed on Jul. 12, 2022, which claims priority to Chinese Patent Application No. 202210730342.3, filed on Jun. 24, 2022. The disclosures of International Application No. PCT/CN2022/105094 and Chinese Patent Application No. 202210730342.3 are hereby incorporated by reference in their entireties.

BACKGROUND

At present, dynamic random access memories (DRAMs) are mostly manufactured by using a $6F^2$ layout modes and a buried word line process. However, with this process, the miniaturization of DRAMs becomes very difficult. The performance of the DRAMs may be improved by using new materials. However, this undoubtedly increases the process complexity and the manufacturing cost of DRAMs.

On this basis, in a related art, a DRAM with a $4F^2$ layout is manufactured by using a gate-all-around or double-gate process, and the DRAM with a $4F^2$ layout needs to form a bit line staircase or a word line staircase. However, the bit line staircase has great sensing noise when the DRAM is operated, and the word line staircase has the problem of word line coupling and the problem that the interconnection of word lines on the same plane in the process are difficult to realize for a multi-layer stack.

SUMMARY

The disclosure relates to the technical field of semiconductors, and relates, but is not limited, to a semiconductor structure, a method for forming the same and a layout structure.

In view of this, embodiments of the disclosure provide a semiconductor structure, a method for forming the same and a layout structure.

In the first aspect, embodiments of the disclosure provide a method for forming a semiconductor structure. The method includes the following operations.

A substrate is provided. The substrate includes a first area and a second area arranged in sequence in a second direction. The first area includes active layers arranged at intervals in a third direction.

An initial gate structure located on a surface of each of the active layers is formed in the first area.

The initial gate structures are etched to form comb-shaped gate structures stacked in the third direction. Each of the comb-shaped gate structures at least includes first gate structures arranged at intervals in a first direction. The first direction, the second direction and the third direction are perpendicular to one another, and the first direction and the second direction are parallel to a surface of the substrate.

Bit line structures extending in the third direction and capacitor structures extending in the second direction are formed in the second area. Each of the bit line structures and each of the capacitor structures are respectively connected to one corresponding first gate structure.

In the second aspect, embodiments of the disclosure provide a semiconductor structure, which includes: a semiconductor structure, active structures, comb-shaped gate structures, bit line structures and capacitor structures.

The semiconductor substrate includes a first area and a second area arranged in sequence in a second direction.

Active structures are located on a surface of the semiconductor substrate, and the active structures are arranged to an array in a first direction and a third direction.

Each of the comb-shaped gate structures is located on a surface of each of the active structures in the first area, and the comb-shaped gate structure at least includes first gate structures arranged at intervals in the first direction.

The bit line structures extend in the third direction.

The capacitor structures extend in the second direction. Each of the bit line structures and each of the capacitor structure are respectively located on the second area and are connected to one corresponding first gate structure. The first direction, the second direction and the third direction are perpendicular to one another, and the first direction and the second direction are parallel to a surface of the semiconductor substrate.

In the third aspect, embodiments of the disclosure provide a layout structure. The layout structure includes the above-mentioned semiconductor structures arranged at intervals in a second direction.

Each of the semiconductor structures include memory cells arranged in the first direction and the third direction. Each of the memory cells includes a first gate structure and a capacitor structure.

Two adjacent ones of the memory cells are centrosymmetric in the second direction, and projection regions of the capacitor structures of the two adjacent memory cells in the second direction at least partially overlap in the first direction.

BRIEF DESCRIPTION OF THE DRAWINGS

In the drawings (which are not necessarily drawn to scale), similar reference signs may describe similar parts in different views. Similar reference signs with different letter suffixes may represent different examples of similar parts. The drawings generally illustrate the various embodiments discussed herein by way of examples rather than limitation.

DETAILED DESCRIPTION

Figure 1:
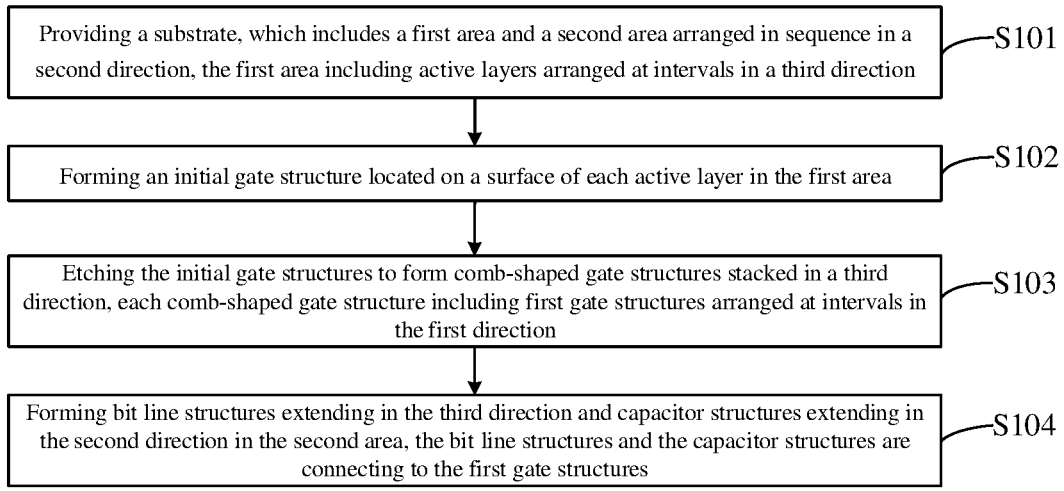
FIG. 1 illustrates a schematic flowchart of a method for forming a semiconductor structure provided by an embodiment of the disclosure.

Exemplary implementation modes of the disclosure will be described below in more detail with reference to the drawings. Although the exemplary implementation modes of the disclosure are shown in the drawings, it should be understood that, the disclosure may be implemented in various forms and should not be limited by the specific implementation modes elaborated herein. On the contrary, these implementation modes are provided to enable a more thorough understanding of the disclosure and to fully convey the scope of the disclosure to those skilled in the art.

In the following description, a large number of details are given to provide a more thorough understanding of the disclosure. However, it will be apparent to those skilled in the art that the disclosure may be implemented without one or more of these details. In other examples, in order to avoid confusion with the disclosure, some technical features known in the art are not described. That is, all the features of the actual embodiments are not described here, and the known functions and structures are not described in detail.

In the drawings, the dimensions of layers, areas and elements and their relative dimensions may be exaggerated for clarity. Throughout, the same reference signs represent the same elements.

It is to be understood that description that an element or layer is "on", "adjacent to", "connected to", or "coupled to" another element or layer may refer to that the element or layer is directly on, adjacent to, connected to or coupled to the other element or layer, or there may be an intermediate element or layer. On the contrary, description that an element is "directly on", "directly adjacent to", "directly connected to" or "directly coupled to" another element or layer refers to that there is no intermediate element or layer. It is to be understood that, although various elements, components, areas, layers, and/or parts may be described with terms first, second, third, etc., these elements, components, areas, layers, and/or parts should not be limited to these terms. These terms are used only to distinguish one element, component, area, layer or part from another element, component, area, layer or part. Therefore, a first element, component, area, layer, or part discussed below may be represented as a second element, component, area, layer or part without departing from the teaching of the disclosure. However, when second element, component, area, layer, or part is discussed, it does not mean that the first element, component, area, layer, or part must exist in the disclosure.

The terms used herein are intended only to describe specific embodiments and are not a limitation of the disclosure. As used herein, singular forms "a/an", "one" and "said/the" may also be intended to include the plural forms, unless otherwise specified types in the context. It is also to be understood that, when terms "composed of" and/or "comprising/including" are used in this specification, the presence of the features, integers, steps, operations, elements, and/or components may be determined, but the presence or addition of one or more other features, integers, steps, operations, elements, components, and/or groups is also possible. As used herein, terms "and/or" includes any and all combinations of the related listed items.

Before introducing the embodiments of the disclosure, three directions for describing the three-dimensional structure that may be used in the following embodiments are defined first. Taking a Cartesian coordinate system as an example, the three directions may include an X-axis direction, a Y-axis direction, and a Z-axis direction. The substrate may include a top surface located on a front side and a bottom surface located on a back side opposite to the front side. The direction perpendicular to the top surface and the bottom surface of the substrate is defined as the third direction in a case of ignoring the flatness of the top surface and the bottom surface. In the direction of the top surface and the bottom surface (that is, the plane on which the substrate is located) of the substrate, two directions that intersect each other (e.g., perpendicular to each other) are defined. For example, a word line extending direction may be defined as the first direction, a capacitor structure extending direction may be defined as a second direction, and a plane direction of the substrate may be determined on the basis of the first direction and the second direction. Here, the first direction, the second direction and the third direction are perpendicular to one another. In the embodiments of the disclosure, the first direction is defined as an X-axis direction, the second direction is defined as the Y-axis direction, and the third direction is defined as the Z-axis direction.

The embodiments of the disclosure provide a method for forming a semiconductor structure. FIG. 1 illustrates a schematic flowchart of a method for forming a semiconductor structure provided by an embodiment of the disclosure. As shown in FIG. 1, the method for forming a semiconductor structure includes the following operations.

At S101, a substrate is provided. The substrate includes a first area and a second area arranged in sequence in a second direction. The first area includes active layers arranged at intervals in a third direction.

In the embodiments of the disclosure, the substrate at least includes a semiconductor substrate. The semiconductor substrate may be a silicon substrate. The semiconductor substrate may also include other semiconductor elements such as germanium (Ge), or semiconductor compounds such as silicon carbide (SiC), gallium arsenide (GaAs), gallium phosphide (GaP), indium phosphide (InP), indium arsenide (InAs), or indium antimonide (InSb), or semiconductor alloys such as silicon germanium (SiGe), gallium arsenide phosphide (GaAsP), indium aluminum arsenide (AlInAs), gallium aluminum arsenide (AlGaAs), indium gallium arsenide (GaInAs), indium gallium phosphide (GaInP), and/or indium gallium arsenide phosphide (GaInAsP) or a combination thereof.

In the embodiments of the disclosure, the first area and the second area may respectively be used to form different functional structures. For example, the first area may be arranged to form gate structures and step-shaped word line structures. The second area may be arranged to form capacitor structures and bit line structures.

At S102, an initial gate structure located on a surface of each of the active layers is formed in the first area.

In the embodiments of the disclosure, each initial gate structure includes a gate dielectric layer and a gate conductive layer located on a surface of the gate dielectric layer.

At S103, the initial gate structures are etched to form comb-shaped gate structures stacked in the third direction. Each of the comb-shaped gate structure at least includes first gate structures arranged at intervals in a first direction.

In the embodiments of the disclosure, each first gate structure may be a double-gate structure. The first gate structure covers a first surface and a second surface, in the third direction, of the active layer. The projection of the first gate structure on the surface of the substrate may be in a U shape. In other embodiments, the projection of the first gate structure on the surface of the substrate may also be a rectangle.

In some embodiments, the comb-shaped gate structure further includes: a second gate structure connected to each of the first gate structures located on the same layer. The second gate structure may be a tri-gate structure. For example, the second gate structure covers a first surface and a second surface, in the third direction, of the active layer, and covers a surface, in the second direction, of the active layer.

In the embodiments of the disclosure, the dimension of the first gate structure in the second direction may be 2-3 times the dimension of the second gate structure in the second direction.

In the embodiments of the disclosure, a plurality of comb-shaped gate structures located on the same layer in the first direction are connected with one another through the second gate structures, and gate metal layers of the comb-shaped gate structures may serve as word lines of the semiconductor structure, so that not only the interconnection of the word lines in the same plane of a multi-layer stacked structure can be realized, but also the dimensions of the word lines can be controlled, thereby reducing a coupling effect between word line stairs.

At S104, bit line structures extending in the third direction and capacitor structures extending in the second direction are formed at the second area. Each of the bit line structures and each of the capacitor structures are respectively connected to one corresponding first gate structure.

The formed capacitor structures in the embodiments of the disclosure extend in the second direction. That is to say, the capacitor structures formed in the embodiments of the disclosure are arranged horizontally, and the horizontal capacitor structure can reduce the risk of tipping or breaking, so that the stability of the capacitor structures can be improved. In addition, a plurality of horizontal capacitor structures and comb-shaped gate structures can be stacked to form a three-dimensional semiconductor structure, so that the integration degree of the semiconductor structure can be improved, and the miniaturization can be realized.

FIG. 2A to FIG. 2M and FIG. 3A to FIG. 3I illustrate schematic structural diagrams showing a process for forming a semiconductor structure provided by an embodiment of the disclosure. Next, the process for forming the semiconductor structure provided by the embodiment of the disclosure is further described in detail with reference to FIG. 2A to FIG. 2M and FIG. 3A to FIG. 3I.

First, reference is made to FIG. 2A to FIG. 2G. At S101, a substrate is provided. The substrate includes a first area A and a second area B arranged in sequence in a second direction. The first area A includes active layers 13 arranged at intervals in a third direction.

In some embodiments, the substrate may be formed by the following operations. A semiconductor substrate 10 is provided; a stacked structure 11 located in the first area A and the second area B is formed on a surface of the semiconductor substrate 10, in which the stacked structure 11 includes first semiconductor layers 111 and second semiconductor layers 112 stacked alternately; the first semiconductor layers 111 in the first area A are removed to expose the second semiconductor layers 112 of the first area A; a thinning processing is performed on the exposed second semiconductor layers 112 to form initial active layers 12; and the initial active layers 12 is processed to form the active layers 13.

Figure 2A:
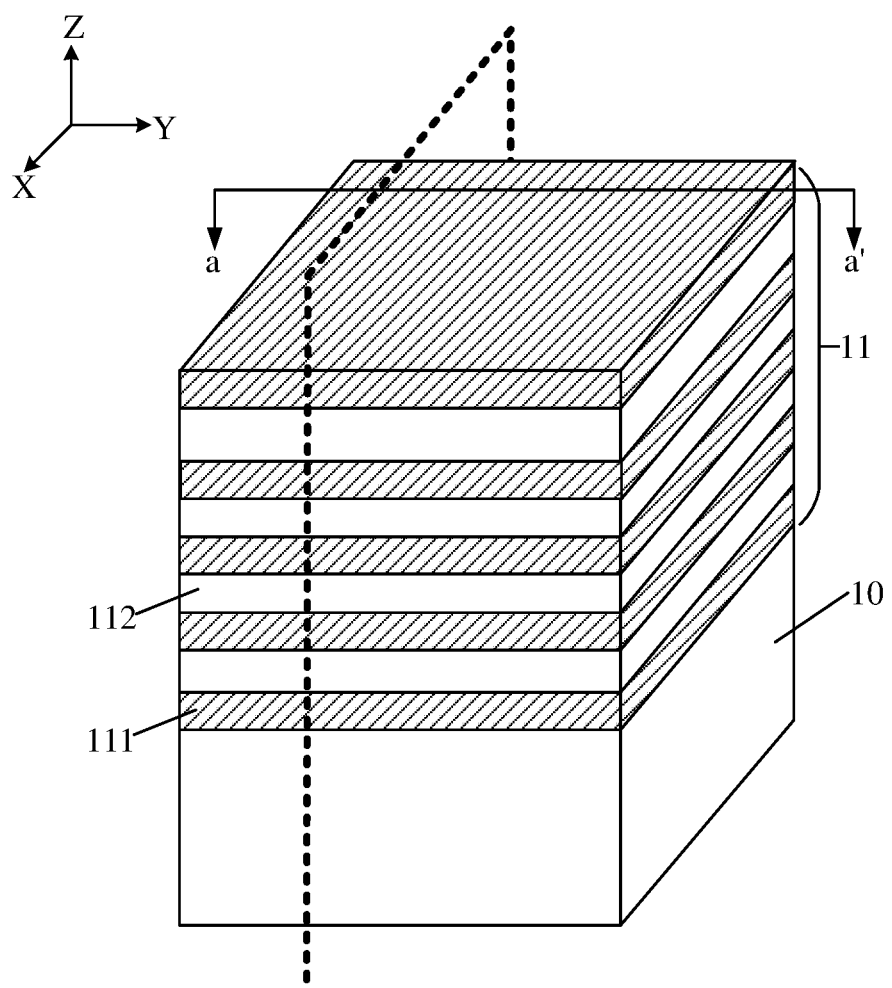
FIG. 2A to FIG. 2M and FIG. 3A to FIG. 3I illustrate schematic structural diagrams showing a process for forming a semiconductor structure provided by an embodiment of the disclosure.
Figure 2B:
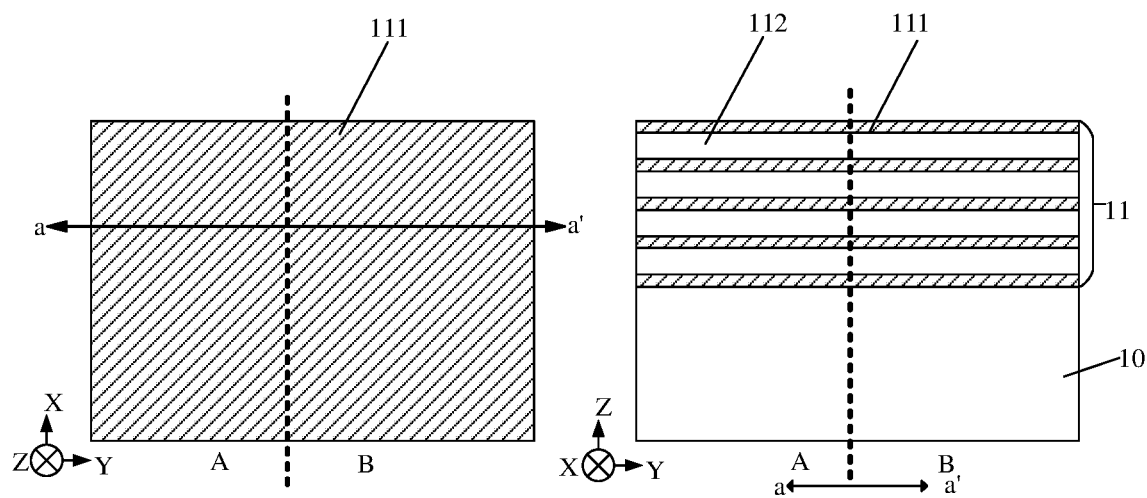

As shown in FIG. 2A and FIG. 2B, the stacked structure 11 located at the first area A and the second area B is formed on the surface of the semiconductor substrate 10. The stacked structure 11 includes the first semiconductor layers 111 and the second semiconductor layers 112 stacked alternately.

In the embodiments of the disclosure, the material of the first semiconductor layers 111 may be Ge, SiGe, or SiC, or may also be silicon-on-insulator (SOI) or a germanium-on-insulator (GOI). The second semiconductor layers 112 may be silicon layers, or may also include other semiconductor elements such as germanium, or include semiconductor compounds such as silicon carbide, gallium arsenide, gallium phosphide, indium phosphide, indium arsenide or indium antimonide, or include semiconductor alloys such as silicon germanium, arsenic gallium phosphide, indium aluminum arsenide, gallium aluminum arsenide, indium gallium arsenide, indium gallium phosphide and/or indium gallium arsenide phosphate, or a combination thereof.

In the embodiments of the disclosure, the material of the first semiconductor layers 111 and the material of the second semiconductor layers 112 are different since the first semiconductor layers 111 need to be removed and the second semiconductor layers 112 need to be retained subsequently. Therefore, have there is a greater etching selective ratio of the first semiconductor layers 111 to the second semiconductor layers 112. For example, the etching selective ratio of the first semiconductor layers 111 relative to the second semiconductor layers 112 may be 5 to 15, so that the first semiconductor layers 111 are etched and removed more easily relative to the second semiconductor layers 112 during etching.

In the embodiments of the disclosure, the thickness of the first semiconductor layers 111 may be 5 to 50 nm, such as 8 nm or 45 nm. The thickness of the second semiconductor layers 112 may be 15 to 100 nm, such as 20 nm or 75 nm. The number of the first semiconductor layers 111 and the number of the second semiconductor layers 112 in the stacked structure 11 may be set according to the required capacitor density (or storage density). The greater the numbers of the first semiconductor layers 111 and the second semiconductor layers 112, the higher the integration degree of the formed semiconductor structure as well as the greater the capacitor density.

In the embodiments of the disclosure, the first semiconductor layers 111 and the second semiconductor layers 112 may be formed by any one of the following deposition processes: a chemical vapor deposition (CVD) process, a physical vapor deposition (PVD) process, an atomic layer deposition (ALD) process, a spin coating process, a coating process or a thin-film process.

Figure 2C:
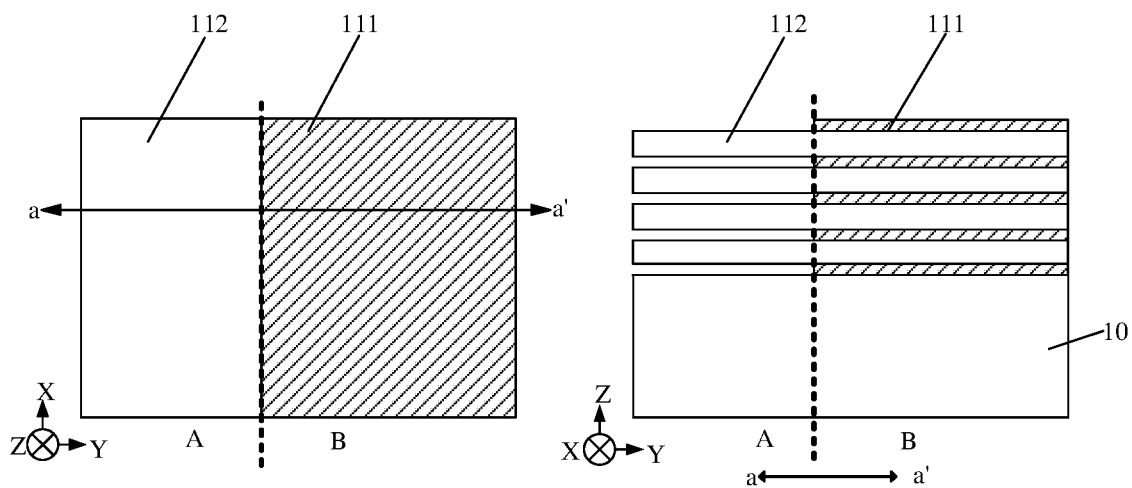

As shown in FIG. 2C, the first semiconductor layers 111 in the first area A are removed, so as to expose the second semiconductor layers 112 in the first area A.

In the embodiments of the disclosure, the first semiconductor layers 111 in the stacked structure 11 may be removed by wet etching (for example, etching by a strong acid such as concentrated sulfuric acid, hydrofluoric acid, or concentrated nitric acid) or by dry etching. The first semiconductor layers 111 have higher etching selectivity relative to the second semiconductor layers 112, so that the second semiconductor layers 112 may not be damaged when the first semiconductor layers 111 are removed.

Figure 2D:
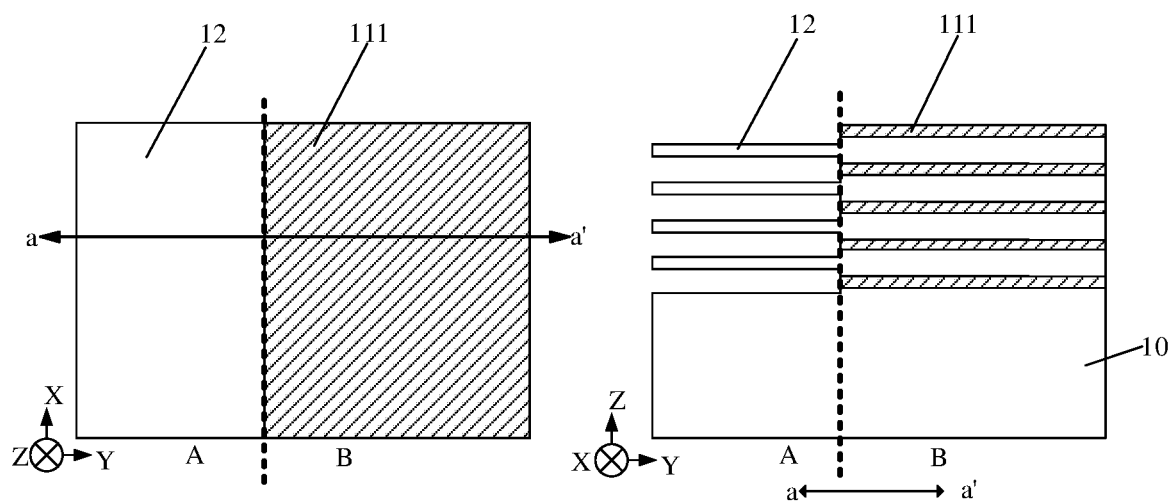

As shown in FIG. 2D, thinning processing is performed on the exposed second semiconductor layers 112, so as to form the initial active layers 12.

In the embodiments of the disclosure, the second semiconductor layers 112 may be subjected to the thinning processing with the following two modes, so as to form the initial active layers 12.

Mode 1: the second semiconductor layers 112 are directly subjected to dry etching, and the etching is stopped when the required thickness is formed.

Mode 2: the second semiconductor layers 112 are oxidized in-situ to oxidize part of each second semiconductor layer 112 into a silicon oxide layer, and the silicon oxide layer is removed by the wet etching or dry etching technologies.

In the embodiments of the disclosure, the second semiconductor layers 112 are thinned to 15 to 20 nm to form the initial active layers 12. For example, the thickness of the formed initial active layers 12 may be 18 nm, so that a channel area formed by a fully depleted semiconductor layer may be formed. At this moment, holes are easily recombined in the source region without accumulating, so that a floating body effect can be improved. In addition, since the gap between two adjacent initial active layers 12 becomes large, a larger space is reserved for the subsequent formation of the gate structures and the word line structures, thereby reducing a word line coupling effect, and the preparation process complexity and the manufacturing cost of the gate structures and the word line structures.

It is to be noted that, in other embodiments, the second semiconductor layers 112 may not be subjected to the thinning processing.

In some embodiments, the operation that the initial active layers 12 are processed to form the active layers 13 may include the following operations. A sacrificial layer 121 and a first isolating layer 122 are formed on a surface of each initial active layer 12 in sequence. The first isolating layers 122 fill up the gaps between the sacrificial layers 121. Each initial active layer 12 is removed with a first length in the second direction to form a first space. Each sacrificial layer 121 is removed with a second length in the second direction to expose part of each initial active layer 12 to form a second space. The second space includes the first space, and the second length is greater than the first length, thus the exposed part of each initial active layer 12 forms the active layer 13.

Figure 2E:
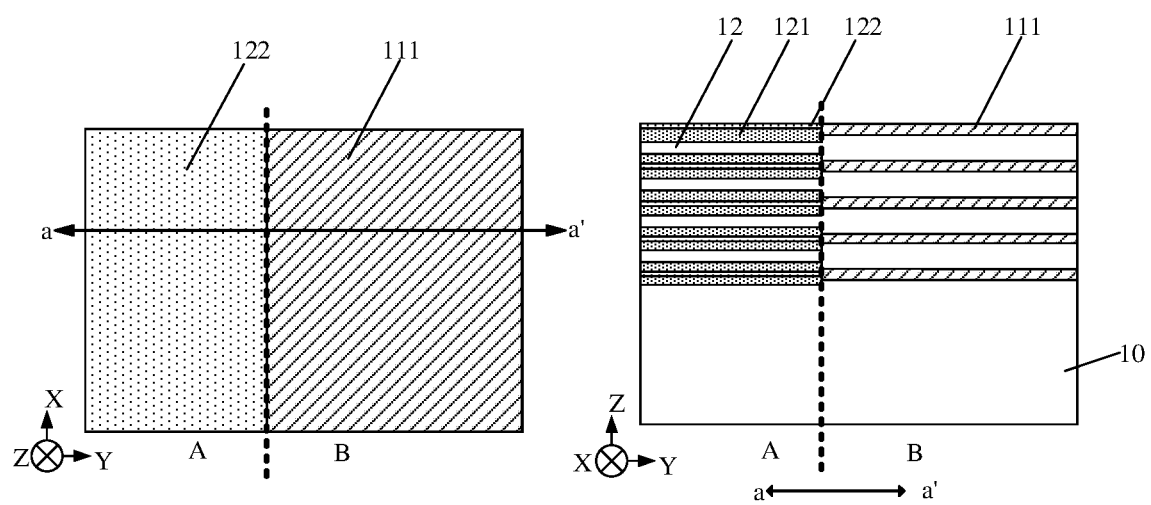
Figure 2F:
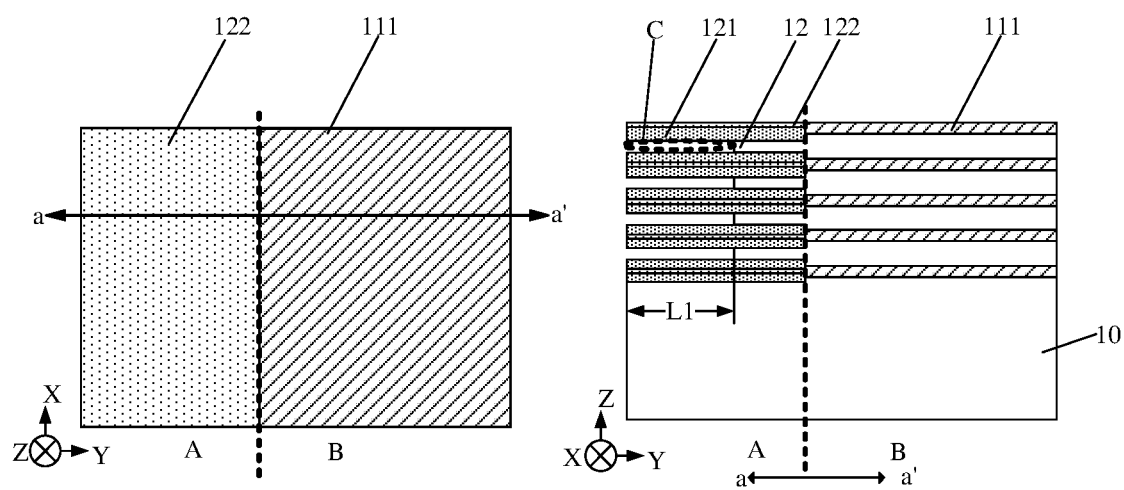

As shown in FIGS. 2E and 2F, the sacrificial layer 121 and the first isolating layers 122 are formed on the surface of each initial active layer 12 in sequence, and the initial active layer 12 is removed with the first length L1 in the Y-axis direction, so as to form the first space C.

In the embodiments of the disclosure, the material of the sacrificial layers 121 may be silicon oxide or other suitable materials. The material of the first isolating layers 122 may be silicon oxide or other suitable materials. Here, the sacrificial layers 121 have a different etching selectivity relative to the first isolating layers 122. For example, the etching selectivity ratio of the sacrificial layers 121 to the semiconductor substrate 10 is 5 to 10 times that of the first isolating layers 122 to the semiconductor substrate 10. The sacrificial layers 121 and the first isolating layers 122 may be formed by any suitable deposition process, such as the CVD process, the PVD process, the ALD process, the spin coating process, the coating process or a furnace tube process.

In the embodiments of the disclosure, the thickness of the sacrificial layers 121 may be 15 to 20 nm, such as 17 nm; and the thickness of the first isolating layers 122 may be 10 to 20 nm, such as 15 nm.

In the embodiments of the disclosure, each first isolating layer 122 may isolate two adjacent ones of the comb-shaped gate structures on one hand, and may serve as a supporting structure of the semiconductor structure together with a subsequently formed supporting layer, so as to improve the stability of the semiconductor structure.

In the embodiments of the disclosure, each initial active layer 12 is laterally etched and removed with the first length L1 by a wet etching process. An etching solution used by wet etching may be hydrofluoric acid solution, or may also be a mixed solution of diluted hydrofluoric acid and aqueous ammonia.

Figure 2G:
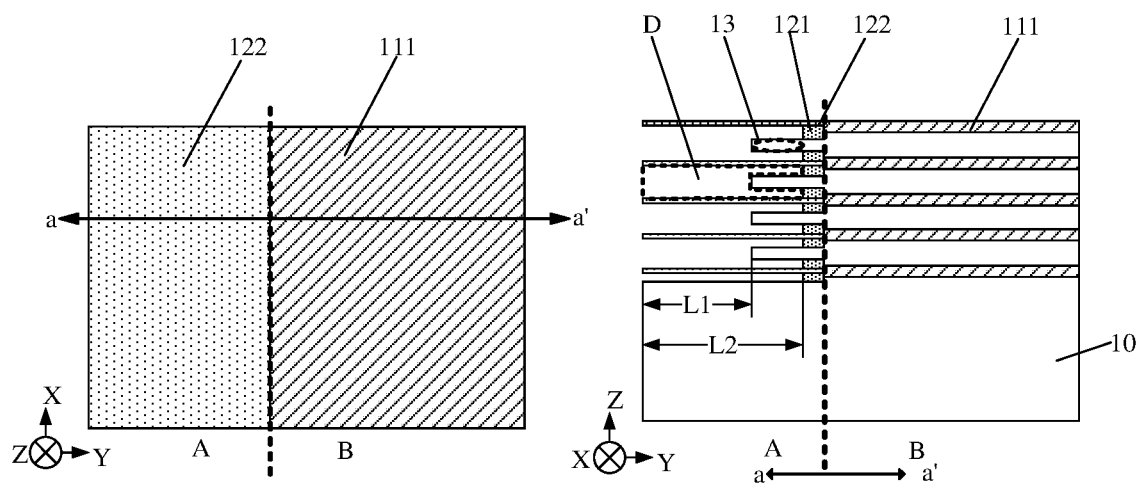

As shown in FIG. 2G, each sacrificial layer 121 is removed with the second length L2 in the second direction to expose part of each initial active layer 12, so as to form the second space D. The second space D includes the first space C, the second length L2 is greater than the first length L1, and the exposed part of the initial active layer 12 forms the active layer 13.

In the embodiments of the disclosure, each sacrificial layer 121 is laterally etched and removed with the second length L2 by a wet etching process, so as to form the active layer 13. The etching solution used by the wet etching may be a mixed solution of diluted hydrofluoric acid and aqueous ammonia.

It is to be noted that, when the active layer 13 is formed, the sacrificial layer 121 is not removed completely, and the remaining part of the sacrificial layer 121 is arranged to isolate a subsequently formed comb-shaped gate structure and a corresponding bit line structure, and the comb-shaped gate structure and a corresponding capacitor structure formed later, so as to reduce the generation of leakage current.

Figure 2H:
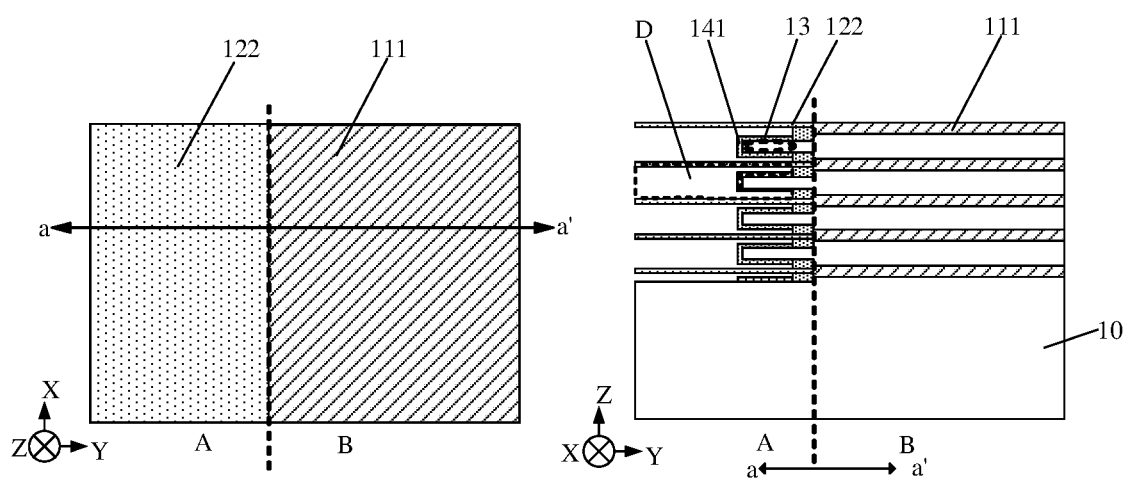
Figure 2I:
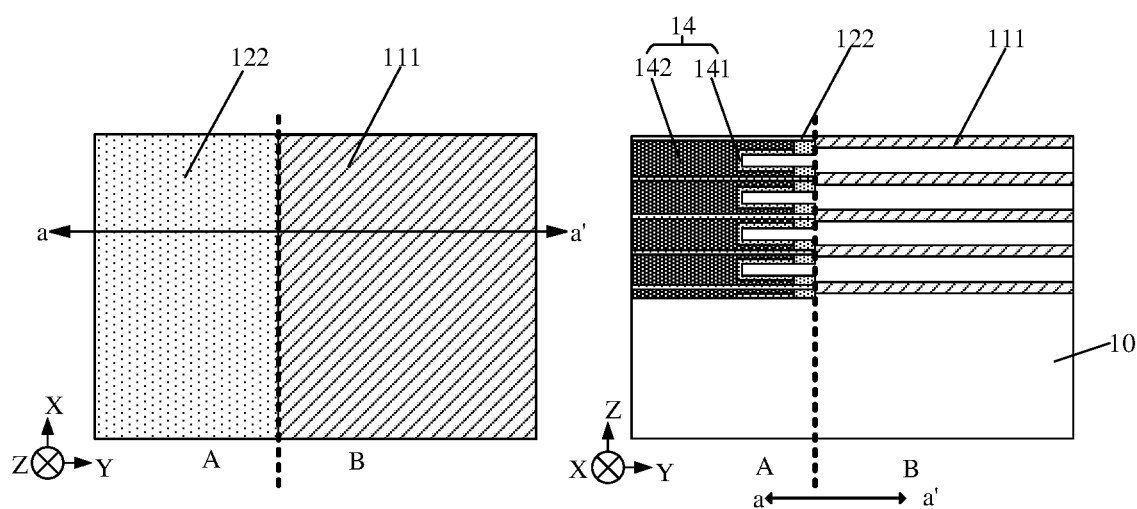
Figure 2J:
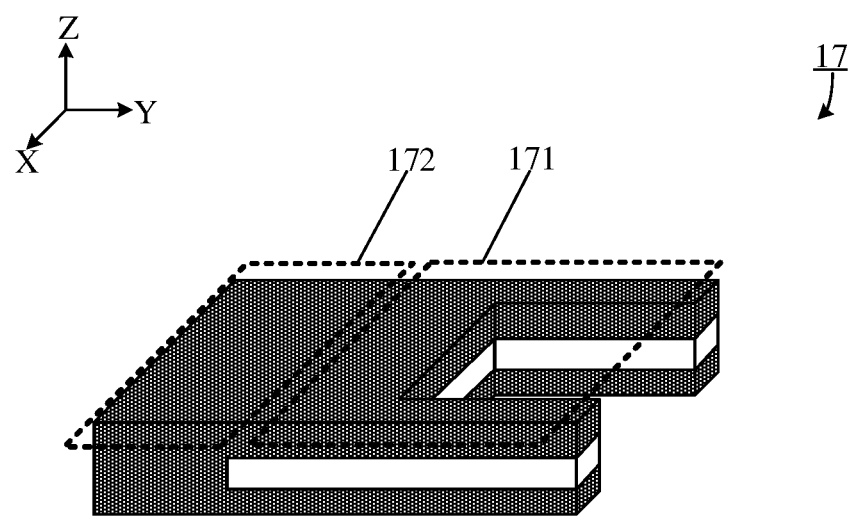
Figure 2K:
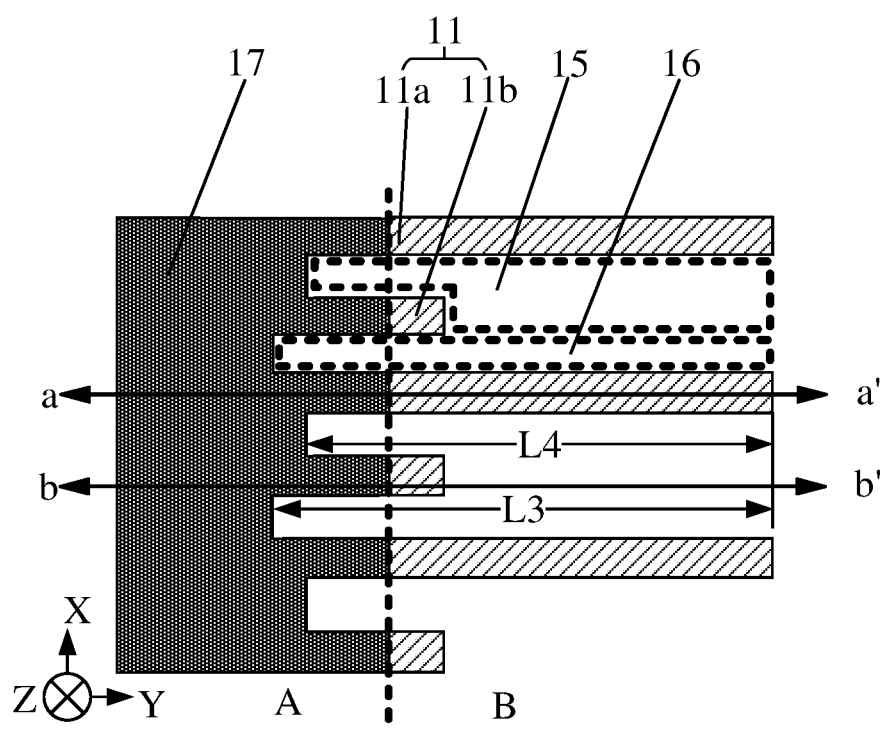
Figure 2L:
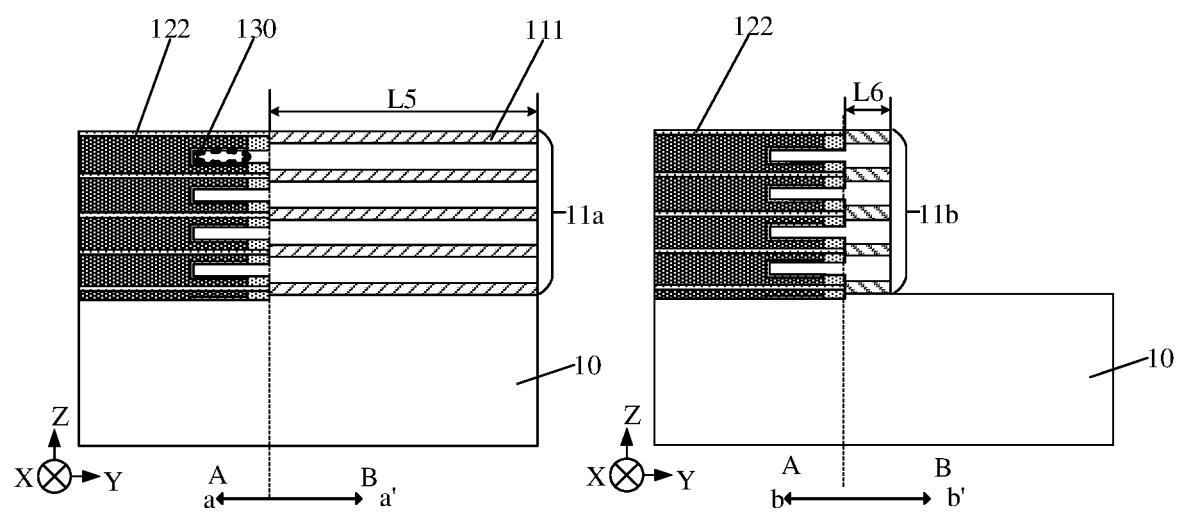

Next, reference may be made to FIGS. 2H and 2L. At S102, an initial gate structure 14 located on a surface of each active layer 13 in the first area A is formed.

In some embodiments of the disclosure, the initial gate structure 14 may be formed by the following operations. A gate dielectric layer 141 and a gate conductive layer 142 are formed on the surface of the active layer 13 in sequence, and the gate conductive layer 142 fills up the second space D.

In the embodiments of the disclosure, the material of the gate dielectric layer 141 may be silicon oxide or other suitable materials. The material of the gate conductive layer 142 may include one of polysilicon, a metal (e.g., tungsten, copper, aluminum, titanium, tantalum, ruthenium, etc.), a metal alloy, a metal silicide, titanium nitride, or any combination thereof.

In the embodiments of the disclosure, the gate dielectric layer 141 may be formed by an in-situ steam generation (ISSG) process. The thickness of the gate dielectric layer 141 may be 4.5 to 10 nm, such as 5 nm or 9 nm. The gate conductive layer 142 may be formed by any suitable deposition process, such as the CVD process, the PVD process or the ALD process.

Next, reference may be made to FIG. 2J and FIG. 2K. At S103, the initial gate structures 14 are etched to form comb-shaped gate structures 17 stacked in the third direction. FIG. 2J illustrates a three-dimensional view of part of the comb-shaped gate structure, and FIG. 2K and FIG. 2L are sectional views of the comb-shaped gate structure.

In some embodiments, each comb-shaped gate structure 17 may at least include first gate structures arranged at intervals in the first direction. In other embodiments, each comb-shaped gate structure 17 may further include a second gate structure 172 connected to each of the first gate structures 171 located on the same layer.

As shown in FIG. 2J, the comb-shaped gate structure 17 includes: first gate structures 171 and second gate structures 172. The second gate structures 172 are connected to the first gate structures 171 located on the same layer.

In the embodiments of the disclosure, the projection of each first gate structure 171 on the surface of the substrate (that is, the semiconductor substrate 10) may be in a U shape. The first gate structure 171 may be a double-gate structure, for example, the first gate structure 171 covers a top surface and a bottom surface of one active layer. The dimension of the first gate structure 171 in the Y-axis direction may be 2-3 times the dimension of the second gate structure 172 in the Y-axis direction.

In other embodiments, the projection of each first gate structure 171 on the surface of the substrate (that is, the semiconductor substrate 10) may also be a rectangle.

In some embodiments, as shown in FIG. 2K and FIG. 2L, the comb-shaped gate structure 17 may be formed by the following operations. Part of the initial gate structures and part of stacked structure 11 in the second area B are simultaneously removed to form L-shaped grooves 15 and isolating grooves 16 arranged alternately in the X-axis direction, and the remaining initial gate structures form the comb-shaped gate structures 17. The dimension L3 of each isolating groove 16 in the second direction is greater than the dimension L4 of each L-shaped groove 15 in the second direction.

In the embodiments of the disclosure, each of the active layers is divided into a plurality of active structures 130 arranged in the X-axis direction by the isolating grooves 16.

In the embodiments of the disclosure, the parts of the stacked structure located at the two sides in the X-axis direction of each L-shaped groove 15 have different sizes along the second direction. For example, the first stacked structure 11a and the second stacked structure 11b are located on both sides of one L-shaped groove 15 in the X-axis direction. The dimension L5 of the first stacked structure 11a in the Y-axis direction is greater than the dimension L6 of the second stacked structure 11b in the Y-axis direction.

In the embodiments of the disclosure, the initial gate structure and part stacked structure 11 in the second area B may be etched by a dry (such as a plasma etching process, a reactive ion etching process or an ion milling process) or wet etching process. The gas in the dry etching may be one of trifluoromethane ($CHF_3$), carbon tetrafluoride ($CF_4$), difluoromethane ($CH_2F_2$), hydrobromic acid (HBr), chlorine ($Cl_2$) or sulfur hexafluoride ($SF_6$), or a combination thereof.

In the embodiments of the disclosure, each formed comb-shaped gate structure 17 has wider channel areas, so that the short channel effect can be reduced, and the performance of the formed semiconductor structure can be improved.

Figure 2M:
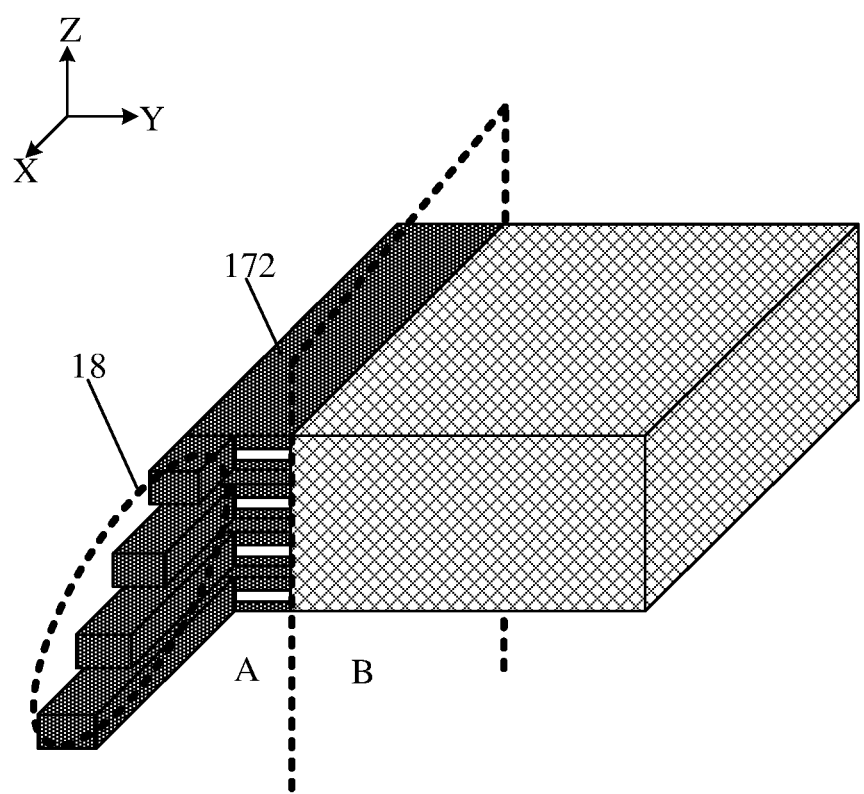

In some embodiments, as shown in FIG. 2M, after the comb-shaped gate structures 17 is formed, the method for forming the semiconductor structure further includes an operation that word line stairs 18 that are stacked in sequence in the third direction is formed. Each layer of word lines of the word line stairs 18 is electrically connected to a plurality of the corresponding second gate structures 172, arranged in first direction, of each of the comb-shaped gate structure.

In the embodiments of the disclosure, firstly, a photoresist layer with a first opening is formed on a surface of the first area A, in which the first opening exposes one end of the first region A, and the first area A is etched through the first opening of the photoresist layer to form a first stair structure. Secondly, a photoresist layer with a second opening is formed on the surface of the first stair structure, in which the second opening exposes part of the first stair structure, and the first stair structure is etched through the second opening of the photoresist layer to form a second stair structure. Herein the dimension of the second opening in the first direction is larger than the dimension of the first opening. Thirdly, a photoresist layer with a third opening is formed on the surface of the second stair structure, in which the third opening exposes part of the second stair structure, and the second stair structure is etched through the third opening of the photoresist layer to form a third stair structure. Herein the dimension of the third opening in the first direction is larger than the dimension of the second opening. The above operations are repeated, and the word line stairs 18 are finally formed after the multiple etching processes. The word line stairs 18 have gradually decreasing lengths from bottom to top in the Z-axis direction.

In other embodiments, the word line stairs 18 may also be formed by the following operations. Firstly, a first word line with a first length is formed on the surface of the substrate in the first area A, herein the first word line is electrically connected to a first layer of comb-shaped gate structure 17 at the bottommost layer in the X-axis direction. Secondly, a first isolating unit with a second length is formed on a surface of the first word line, a second word line with the second length is formed on a surface of the first isolating unit, and the second word line is electrically connected to a second layer of comb-shaped gate structure 17 at a second layer from the bottom in the third direction. Herein the first length is greater than the second length, and the first isolating unit is configured to isolate the adjacent first word line and second word line. Thirdly, a second isolating unit with a third length is formed on a surface of the second word line, and a third word line with the third length is formed on a surface of the second isolating unit, and the third word line is electrically connected to a third layer of comb-shaped gate structure 17 at a third layer from the bottom in the X-axis direction. Herein the second length is greater than the third length, and the second isolating unit is configured to isolate the adjacent second word line and third word line. The abovementioned operations are repeated; and a plurality of word lines are formed to form the word line stairs 18 through multiple forming processes.

In the embodiments of the disclosure, the comb-shaped gate structures 17 are formed, and the connecting method at the word line side is adopted, as such the problem that it is difficult for a stack with multiple layers to interconnect the word lines of the same plane is solved, and the word line coupling can also be controlled by controlling the dimensions of the side-connected word lines.

Finally, reference may be made to FIG. 3A to FIG. 3I. At S104, bit line structures 22 extending in the third direction and capacitor structures 24 extending in the second direction are formed in the second area B, and each of the bit line structures 22 and each of the capacitor structures 24 are respectively connected to one corresponding first gate structure 171.

Figure 3A:
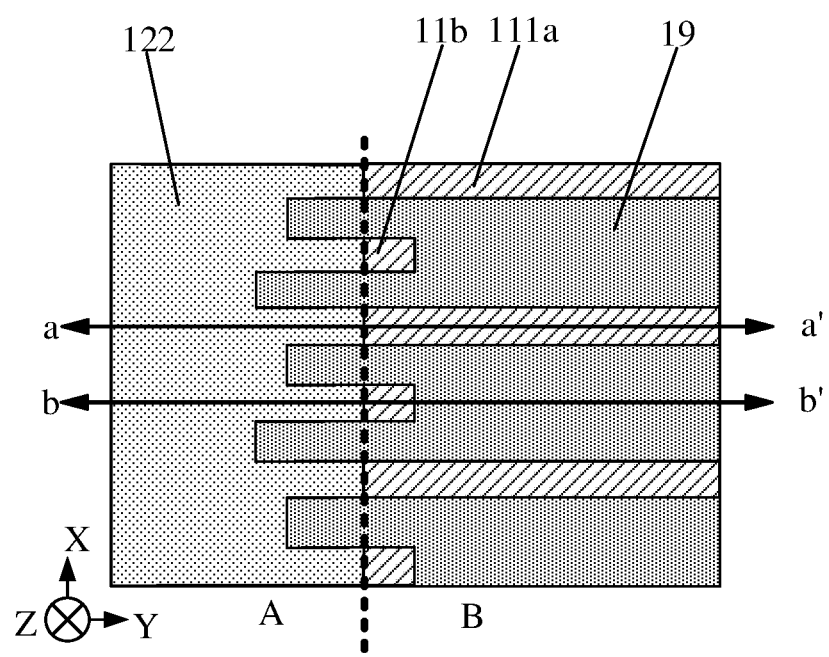
Figure 3B:
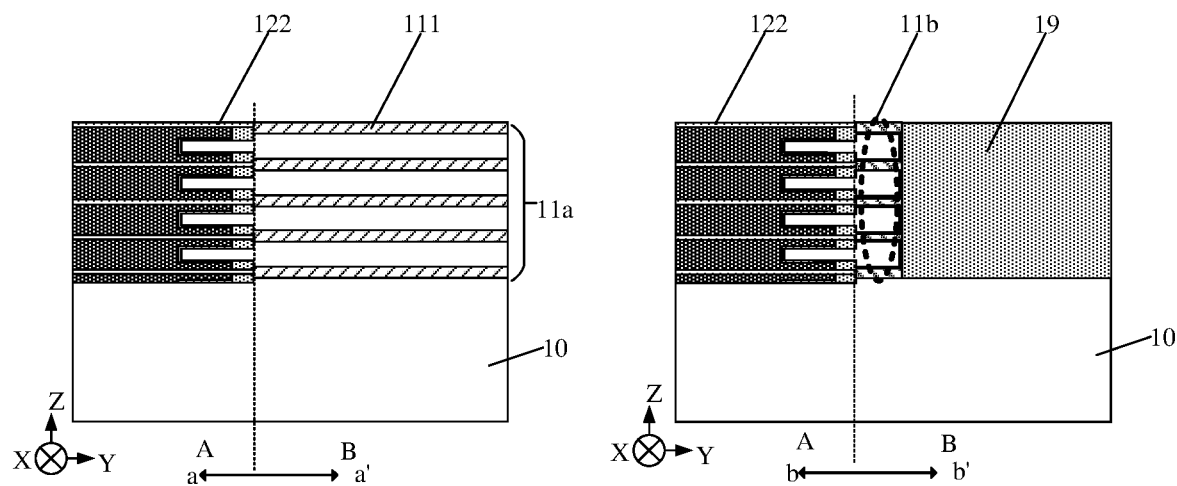

In some embodiments, as shown in FIG. 3A and FIG. 3B, before forming the bit line structures 22 and the capacitor structures 24, the method for forming the semiconductor structure includes an operation that an isolating material is filled in each of the L-shaped grooves 15 and each of the isolating grooves 16, so as to form a second isolating layer 19.

In the embodiments of the disclosure, the isolating material may be silicon oxide, silicon nitride, silicon oxynitride, or other suitable materials. The second isolating layer 19 may be formed by any deposition process.

Figure 3C:
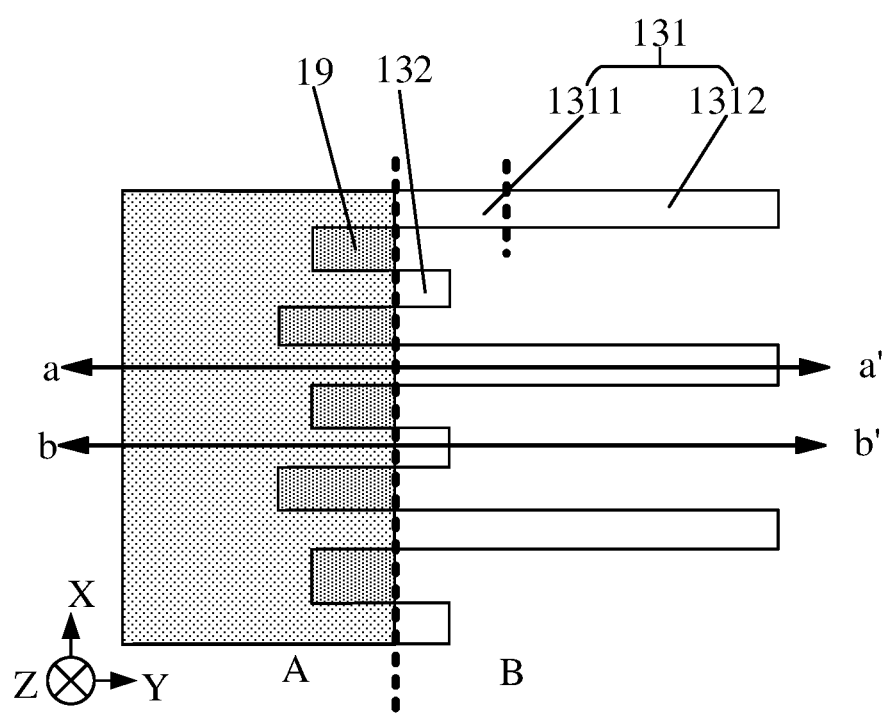
Figure 3D:
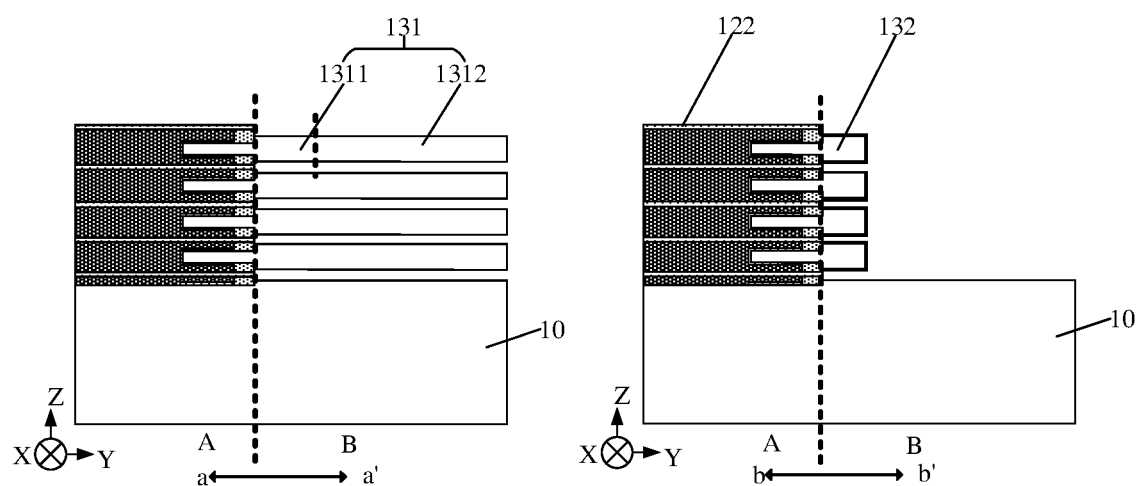

As shown in FIG. 3C and FIG. 3D, the second isolating layers 19 and the first semiconductor layers 111 located in the second area B are removed to expose the second semiconductor layers 112 in the first stacked structures 11a and the second stacked structures 11b. The exposed second semiconductor layers 112 respectively form first active pillars 131 and second active pillars 132 arranged alternately in the X-axis direction. Each first active pillar 131 includes a first sub-pillar 1311 and a second sub-pillar 1312 arranged in sequence in the X-axis direction. The projection of the second active pillar 132 is within a projection region of the first sub-pillar 1311 in the X-axis direction. In the embodiments of the disclosure, the second sub-pillar 1312 is configured to form a capacitor structure. The second active pillar 132 is configured to form a bit line structure.

In the embodiments of the disclosure, the second isolating layers 19 and the first semiconductor layers 111 located in the second area B may be removed by a dry etching technology or a wet etching technology.

In other embodiments, the first active pillars 131 and the second active pillars 132 may also be subjected to thinning processing, which may include the following two modes.

Mode 1: Dry etching is directly performed on the first active pillars 131 and the second active pillars 132, and the etching is stopped until the required thickness is formed.

Mode 2: The first active pillars 131 and the second active pillars 132 are oxidized in-situ. Part of each first active pillar 131 and part of each second active pillar 132 are oxidized into a silicon oxide layer. The silicon oxide layer is removed by a wet etching technology or a dry etching technology.

In the embodiments of the disclosure, a gap between a first active pillar 131 and a second active pillar 132 that are adjacent to each other becomes large by performing the thinning processing on the first active pillar 131 and the second active pillar 132. On one hand, the effective area between electrodes of a formed capacitor structure can be improved, so as to improve the capacitance of the formed capacitor structure. On the other hand, the process complexity for forming the capacitor structures and the bit line structures can also be reduced, so as to reduce the manufacturing cost of the semiconductor structure.

Figure 3E:
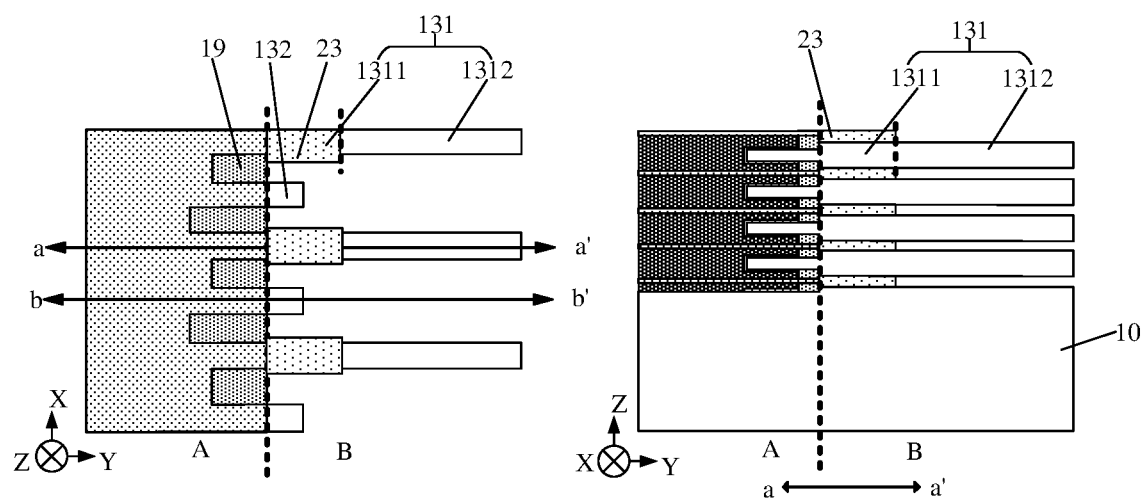

In some embodiments, as shown in FIG. 3E, before forming the capacitor structures 24, after forming the first active pillars 131, the method for forming the semiconductor structure further includes an operation that a supporting layer 23 is formed on a surface of each first sub-pillar 1311. The supporting layers 23 fill gaps between the first sub-pillars 1311.

In the embodiments of the disclosure, the material of the supporting layers 23 may be silicon nitride or silicon carbonitride. The supporting layers 23 are configured to support the subsequently formed capacitor structures to prevent the capacitor structures from collapsing. Therefore, the stability of the formed semiconductor structure is improved on one hand, and adjacent capacitor structures, as well as the capacitor structures and the bit line structures can be isolated from each other to reduce the generation of a leakage current on the other hand.

Figure 3F:
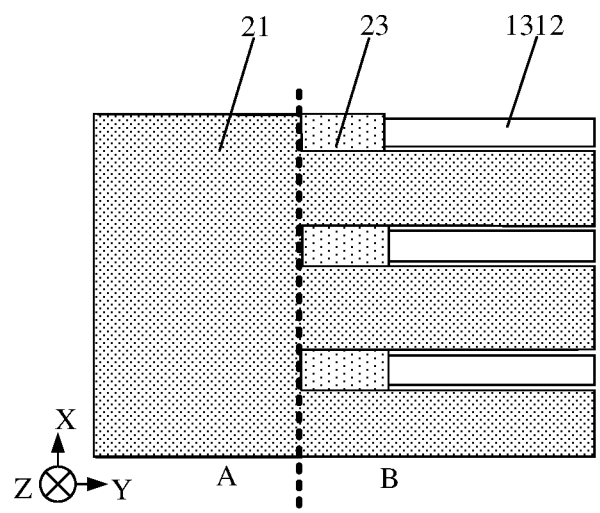

In the embodiments of the disclosure, as shown in FIG. 3F, before forming the capacitor structures, the method for forming the semiconductor structure further includes an operation that a first protective layer 21 is formed on the surface of the first area A and the surfaces of the second active pillars 132. The first protective layer 21 is configured to protect the comb-shaped gate structures 17 that have been formed in the first area A and the second active pillars 132 from being damaged during forming the capacitor structures 24. The material of the first protective layer 21 may be a low-dielectric constant (low K) material, such as doped silicon dioxide, an organic polymer, or a porous material.

Figure 3G:
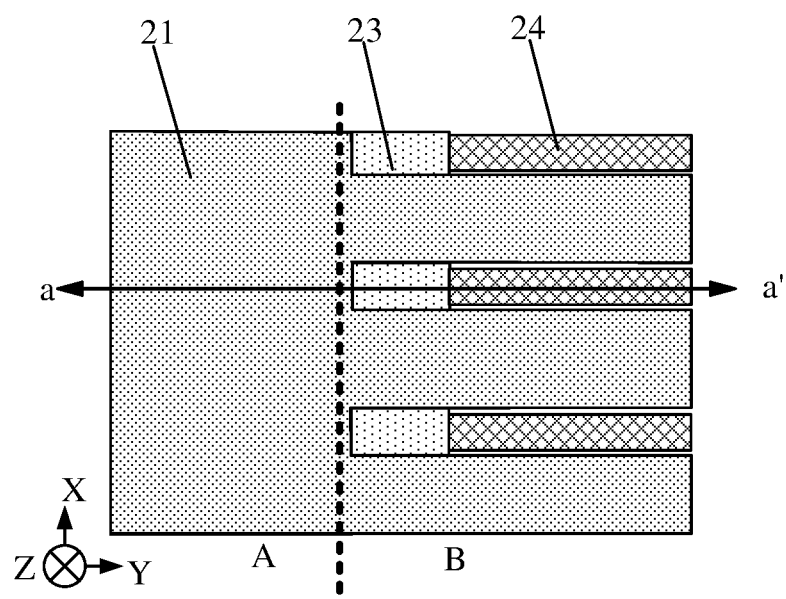
Figure 3H:
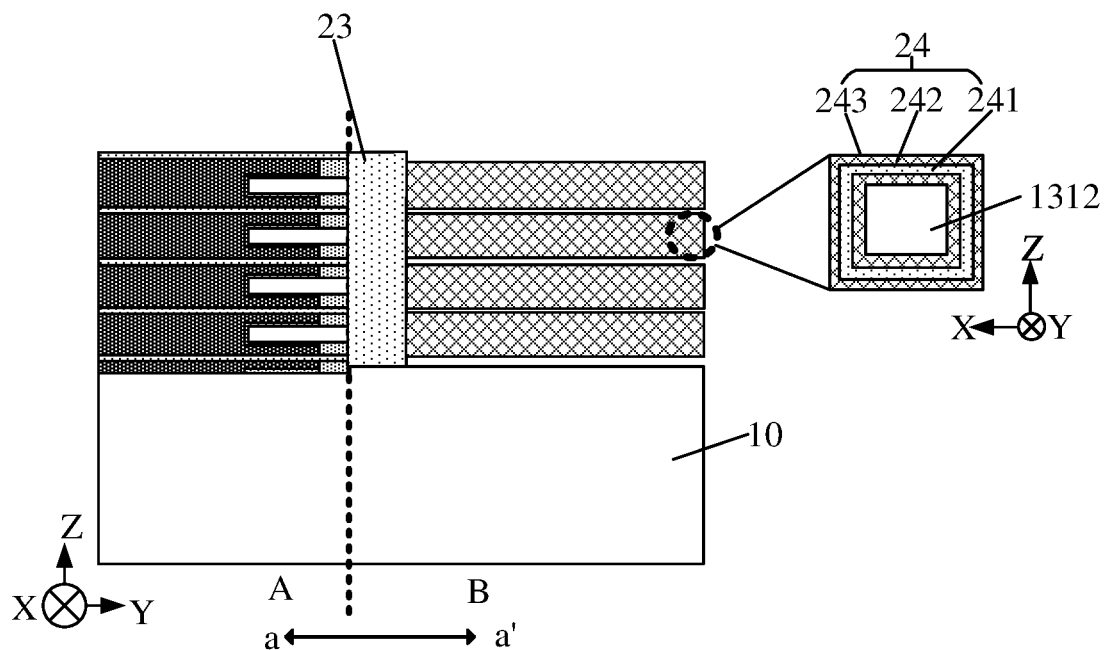

In some embodiments, as shown in FIG. 3G and FIG. 3H, the capacitor structures 24 may be formed by the following operations. A first electrode layer 241, a dielectric layer 242 and a second electrode layer 243 are formed on a surface of each of the second sub-pillars 1312 in sequence, so as form the capacitor structures 24.

In the embodiments of the disclosure, the first electrode layer 241, the dielectric layer 242, and the second electrode layer 243 may be formed by any one of the following deposition processes: a selective atomic layer deposition process, a CVD process, a PVD process, and a spin coating process. The material of the first electrode layer 241 and the second electrode layer 243 may include metal or metal nitride, such as ruthenium (RU) or titanium nitride. The material of the dielectric layer 242 may include a high-K dielectric material, for example, one of lanthanum oxide ($La_2O_3$), aluminum oxide ($Al_2O_3$), hafnium oxide ($HfO_2$), hafnium oxynitride (HfON), hafnium silicate ($HfSiO_x$) or zirconium oxide ($ZrO_2$), or any combination thereof. In other embodiments, the material of the first electrode layer and the second electrode layer may also be polysilicon.

In the embodiments of the disclosure, the capacitor structures 24 extend in the Y-axis direction. That is to say, the capacitor structures 24 are horizontal arranged. On one hand, compared with vertical capacitor structures with a high aspect ratio (the ratio of height to width or diameter), the horizontal capacitor structures can reduce the risk of tipping or breaking, so that the stability of the capacitor structures can be improved. On the other hand, the stacked structure formed by stacking a plurality of capacitor structures in a vertical direction can form a three-dimensional semiconductor structure, so that the integration degree of the semiconductor structure can be improved, and miniaturization can be realized.

In some embodiments, before forming the first electrode layer 241, the method for forming the semiconductor structure further includes an operation that metal silicide is formed on a surface of each of the second sub-pillar 1312. During implementation, a layer of metal material, such as any of cobalt (Co), titanium (Ti), tantalum (Ta), nickel (Ni), tungsten (W), platinum (Pt) and palladium (Pd), may be deposited on the second sub-pillar 1312. After that, the metal material interacts with the second sub-pillar 1312 by a rapid thermal annealing, so that metal silicide is formed on the surface of the second sub-pillar 1312. The metal silicide has a low resistance, thus the contact resistance between a lower electrode and the second sub-pillar can be reduced, thereby reducing the power consumption of the semiconductor structure.

In some embodiments, after forming the capacitor structure 24, the method further includes an operation that the first protective layer 21 is removed. For example, the first protective layer 21 may be removed by a dry or wet etching process.

In some embodiments, the method for forming the semiconductor structure further includes an operation that a conductive layer is formed on a surface of each of the second electrode layer 243, and the conductive layer fills between two adjacent ones of the second electrode layers 243. The material of the conductive material may be polysilicon, or may also be any other suitable conductive material, such as doped polysilicon.

Figure 3I:
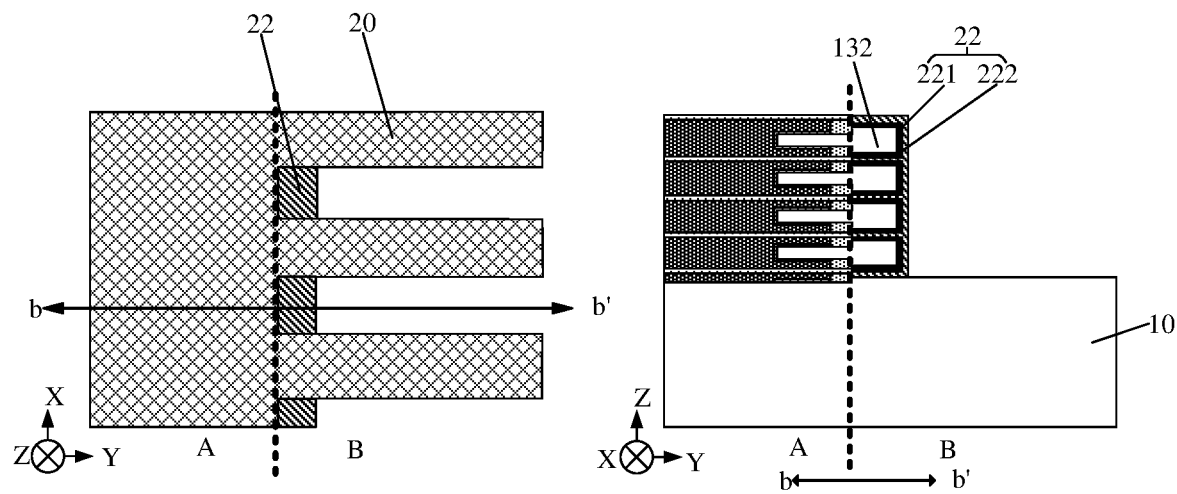

In the embodiments of the disclosure, as shown in FIG. 3I, before forming the bit line structures, the method for forming the semiconductor structure further includes an operation that a second protective layer 20 is formed on the surface of the first area A, the supporting layers 23, and the capacitor structures 24. The second protective layer 20 is configured to protect the comb-shaped gate structures 17 that have been formed, the supporting layers 23 and the capacitor structures 24 from being damaged when the bit line structures 22 are formed. The material of the second protective layer 20 may be a low-dielectric constant material, such as doped silicon dioxide, an organic polymer or a porous material.

In some embodiments, continuing to refer to FIG. 3I, the bit line structures 22 may be formed by the following operation. A third semiconductor layer 221 and a bit line metal layer 222 are formed on a surface of each of the second active pillars 132 in sequence.

The material of the third semiconductor layer 221 may be metal silicide. The metal silicide has a low resistance, thus the contact resistance between the bit line metal layer 222 and the second active pillar 132 can be reduced, thereby further reducing the power consumption of the semiconductor structure. The material of the bit line metal layer 222 may be any material with good electrical conductivity, such as tungsten, cobalt, copper, aluminum, titanium nitride, a titanium-containing metal layer, polysilicon, or any combination thereof.

In some embodiments, after forming the bit line structure 22, the method for forming the semiconductor structure further includes an operation that the second protective layer 20 is removed.

In the embodiments of the disclosure, the comb-shaped gate structures are formed, and the connecting method at word line side is adopted. Therefore, the problem that it is difficult for a stack with multiple layers to interconnect the word lines in the same plane is solved. In addition, the word line coupling effect is reduced by controlling the dimensions of the side-connected word lines. In addition, since the capacitor structures in the embodiments of the disclosure extend in the second direction, that is, the capacitor structures in the embodiments of the disclosure are horizontal. Compared with vertical capacitor structures with a high aspect ratio, the horizontal capacitor structures can reduce the risk of tipping or breaking, so that the stability of the capacitor structure can be improved. Moreover, the stacked structure formed by stacking a plurality of capacitor structures in the third direction can form a three-dimensional semiconductor structure, so as to improve the integration degree of the semiconductor structure and realize miniaturization.

Figure 4A:
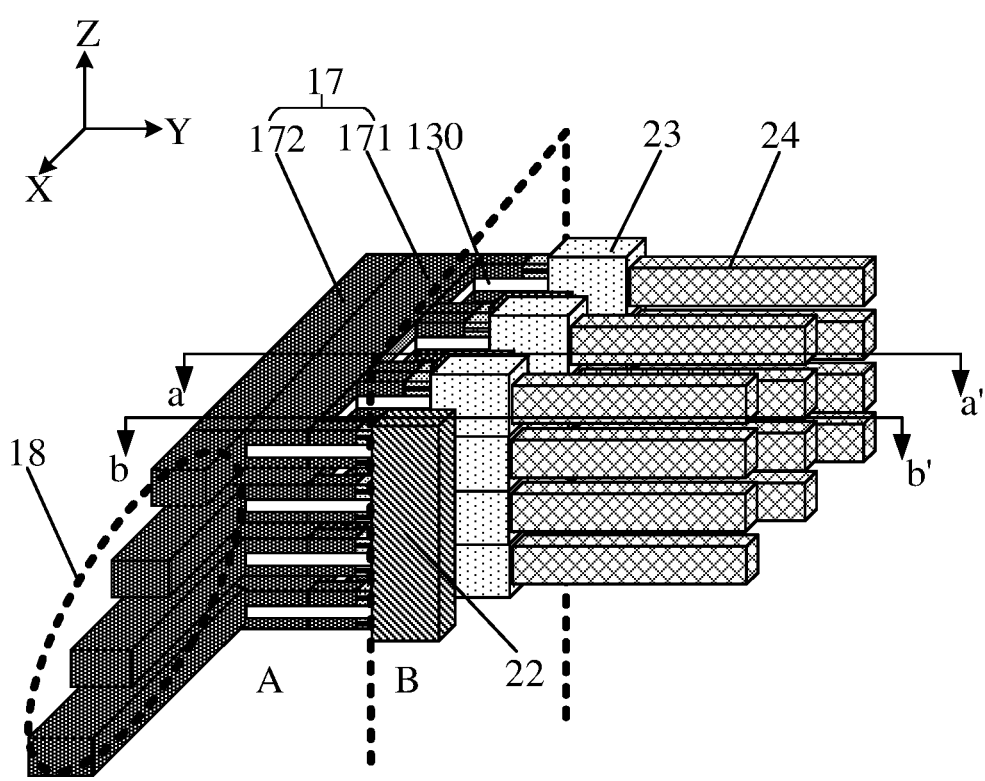
FIG. 4A to FIG. 4C illustrate schematic structural diagrams showing a semiconductor structure provided by an embodiment of the disclosure.
Figure 4B:
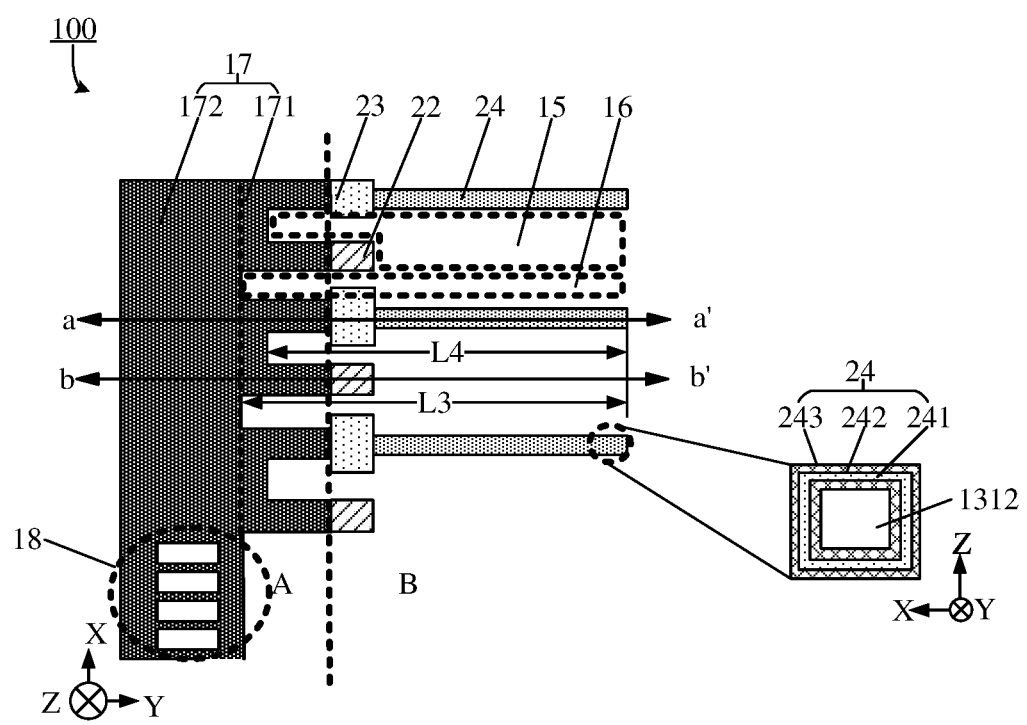
Figure 4C:
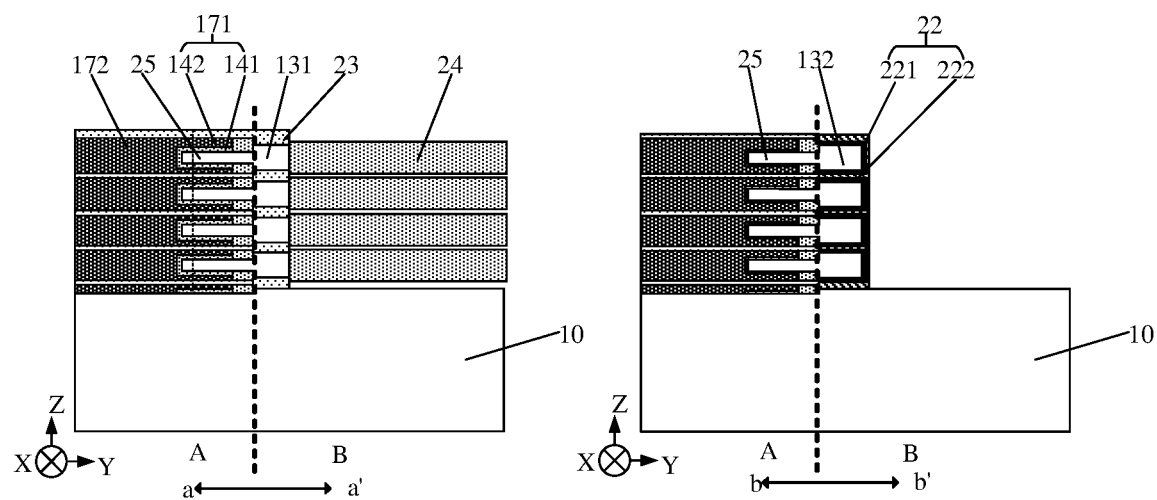

The embodiments of the disclosure further provide a semiconductor structure. FIG. 4A to FIG. 4C illustrate schematic structural diagrams of the semiconductor structure provided by an embodiment of the disclosure. FIG. 4A illustrates a three-dimensional view. As shown in FIG. 4A to FIG. 4C, the semiconductor structure 100 at least includes: a semiconductor substrate 10 which includes a first area A and a second area B arranged in sequence in the second direction (Y-axis direction); active structures 130 located on a surface of the semiconductor substrate 10, which are arranged in an array in the first direction (X-axis direction) and the third direction (Z-axis direction); and a comb-shaped gate structure 17 located on a surface of each of the active structures on the first area A, and the comb-shaped gate structure 17 at least includes first gate structures 171 arranged in the X-axis direction at intervals.

In some embodiments, continuing to refer to FIG. 4A to FIG. 4C, the semiconductor structure 100 further includes: bit line structures 22 extending in the Z-axis direction and capacitor structures 24 extending in the Y-axis direction. The bit line structures 22 and the capacitor structures 24 are located on the second area B, and are connected to first gate structures 171.

In some embodiments, continuing to refer to FIG. 4B and FIG. 4C, each capacitor structure 24 includes a first electrode layer 241, a dielectric layer 242 and a second electrode layer 243. Each bit line structure 22 includes a third semiconductor layer 221 and a bit line metal layer 222.

In some embodiments, continuing to refer to FIG. 4A to FIG. 4C, each comb-shaped gate structure 17 further includes: a second gate structure 172 connected to each of the first gate structures 171 located on the same layer.

In some embodiments, continuing to refer to FIG. 4B and FIG. Cc, each active structure 130 includes a first active pillar 131 and a second active pillar 132 located on the second area B and arranged in the X-axis direction, and a channel pillar 25 located on the first area A. Both the first active pillar 131 and the second active pillar 132 are connected to the channel pillar 25. The first gate structure 171 at least covers a first surface and a second surface, in the Z-axis direction, of the channel pillar 25. The first gate structure 171 includes a gate dielectric layer 141 and a gate conductive layer 142 that are stacked.

In some embodiments, the projection of each channel pillar 25 on the semiconductor substrate 10 is a U shape. In other embodiments, the projection of the channel pillar 25 on the semiconductor substrate 10 may be a rectangle.

In some embodiments, continuing to refer to FIG. 4B, each first active pillar 131 includes a first sub-pillar (not shown) and a second sub-pillar 1312. A capacitor structure 24 is formed on the second sub-pillar 1312. A bit line structure 22 is formed on each second active pillar 132. There is an L-shaped groove 15 between the first active pillar 131 and the second active pillar 132 of the same active structure 130. There is an isolating groove 16 between two adjacent ones of the active structures 130 in the X-axis direction. The dimension L3 of the isolating groove 16 in the Y-axis direction is greater than the dimension L4 of the L-shaped groove 15 in the Y-axis direction.

In some embodiments, continuing to refer to FIG. 4B, the semiconductor structure 100 further includes supporting layers 23. Each supporting layer 23 is located on a surface of the first sub-pillar, and the supporting layer 23 fills between two adjacent ones of the first sub-pillars. The supporting layers 23 are configured to support a plurality of capacitor structures 24, a plurality of bit line structures 22 stacked in the Z-axis direction, and a plurality of comb-shaped gate structures 17.

In some embodiments, continuing to refer to FIG. 4A, the semiconductor structure 100 further includes: word line stairs 18. The word line stairs 18 are stacked in sequence in the Z-axis direction. Each layer of word lines in the word line stairs is connected to a plurality of corresponding second gate structures 172, arranged in the X-axis direction, of the comb-shaped gate structure 17.

In the embodiments of the disclosure, the first gate electrode structure may be a double-gate structure. The dimension of the first gate structure 171 in the Y-axis direction may be 2-3 times the dimension of the second gate structure 172 in the Y-axis direction.

In the embodiments of the disclosure, the formed comb-shaped gate structure has a very wide channel area, so that a short channel effect can be reduced. Meanwhile, the control ability of the gate can further be improved by the formed double-gate structure, thereby improving the performance of the formed semiconductor structure.

The semiconductor structure provided by the embodiment of the disclosure is similar to the semiconductor structure formed by the method provided by the abovementioned embodiments. The technical features not disclosed in detail in the embodiments of the disclosure refer to the abovementioned embodiments for understanding, and will not be elaborated herein.

According to the semiconductor structure provided by the embodiments of the disclosure, the comb-shaped gate structures are formed, and the word line structures are located on an outer side of the comb-shaped gate structures, and can realize the interconnection of word lines on the same plane of the multi-layer stacked structure. In addition, the capacitor structures in the embodiments of the disclosure are horizontal and are arranged in an array in the first direction and the third direction. The horizontal capacitor structures can reduce the risk of tipping or breaking, the stacked structure formed by stacking the plurality of capacitor structures in the third direction can form a three-dimensional semiconductor structure, so as to improve the integration degree of the semiconductor structure and realize miniaturization.

Figure 5A:
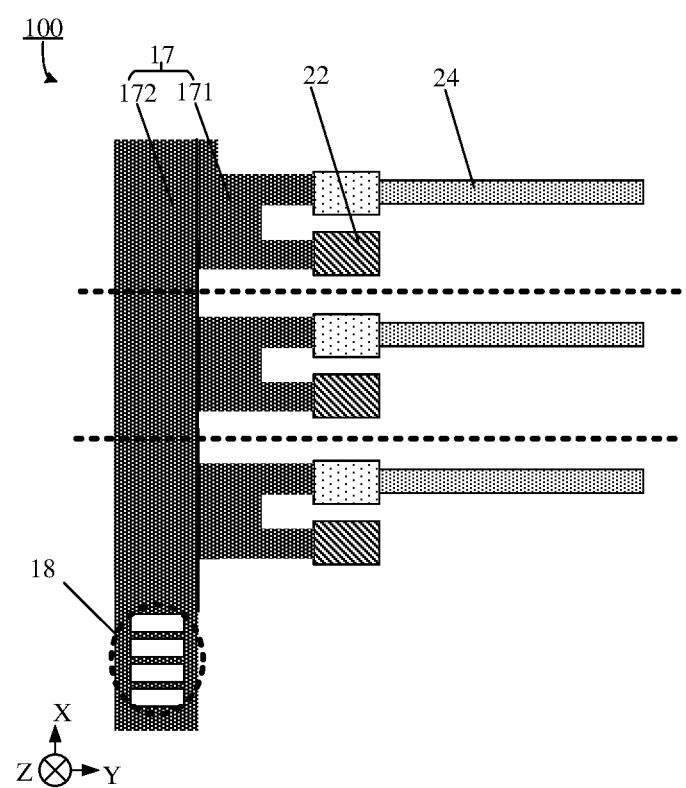
FIG. 5A and FIG. 5B illustrate schematic diagrams of top views of semiconductor structures provided by embodiments of the disclosure.
Figure 5B:
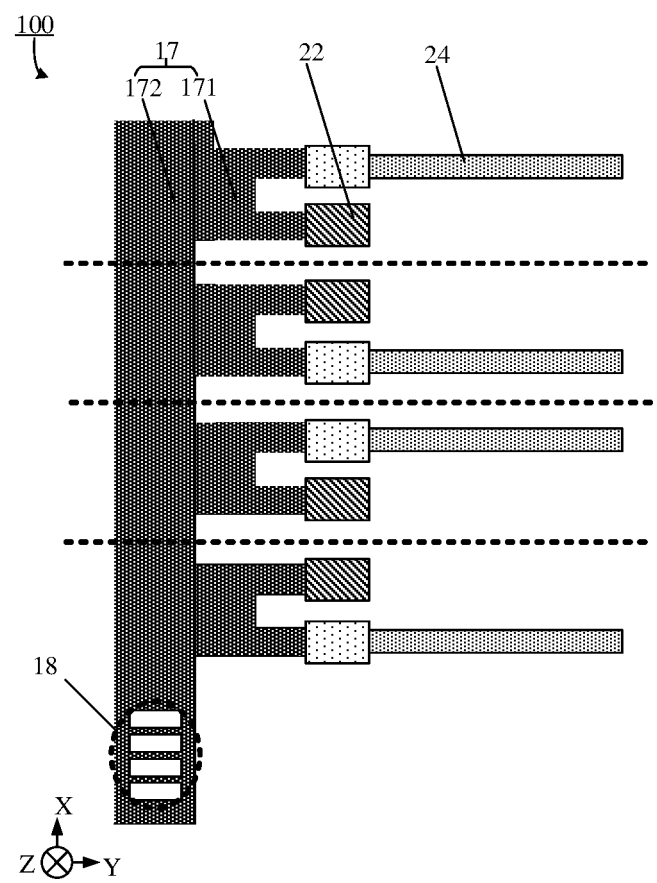

FIG. 5A and FIG. 5B are schematic diagrams of top views of semiconductor structures provided by embodiments of the disclosure. As shown in FIG. 5A and FIG. 5B, the semiconductor structure 100 includes: first gate structures 171, bit line structures 22, and capacitor structures 24 respectively arranged in arrays in the X-axis direction and the Z-axis direction. Each bit line structure 22 and each capacitor structure 24 are respectively connected to one corresponding comb-shaped gate structure 17.

In the embodiments of the disclosure, one first gate structure 171 and one capacitor structure 24 form a memory cell. Adjacent memory cells in the X-axis direction have the same layout (as shown in FIG. 5A), or the adjacent memory cells in the X-axis direction are axisymmetric (as shown in FIG. 5B).

In some embodiments, continuing to refer to FIG. 5A and FIG. 5B, the semiconductor structure 100 includes: second gate structures 172, each connected to all the first gate structures 171 located on the same layer. The first gate structures 171 and the second gate structures 172 arranged in the X-axis direction and located on the same layer form a comb-shaped gate structure 17.

In some embodiments, continuing to refer to FIG. 5A and FIG. 5B, the semiconductor structure 100 further includes: word line stairs 18 extending in the X-axis direction. Each layer of word lines in the word line stairs 18 are connected to a plurality of corresponding first gate structures 171 arranged in the X-axis direction.

Figure 6A:
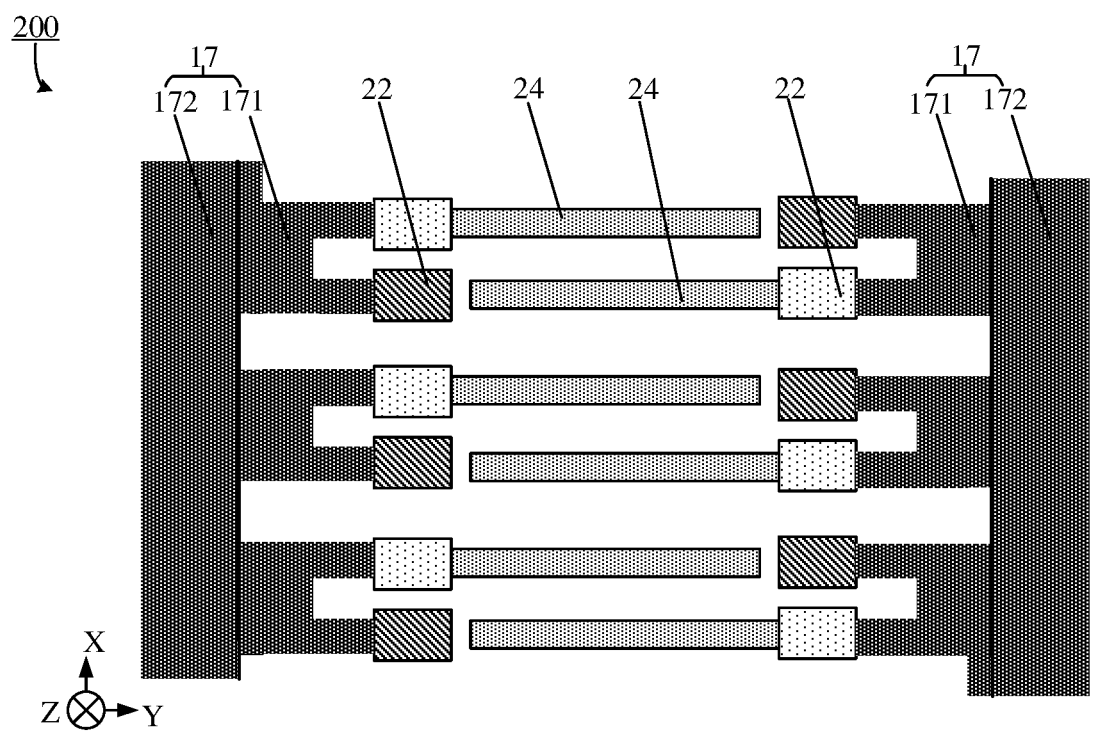
FIG. 6A and FIG. 6B illustrate plane layouts of layout structures provided by embodiments of the disclosure.
Figure 6B:
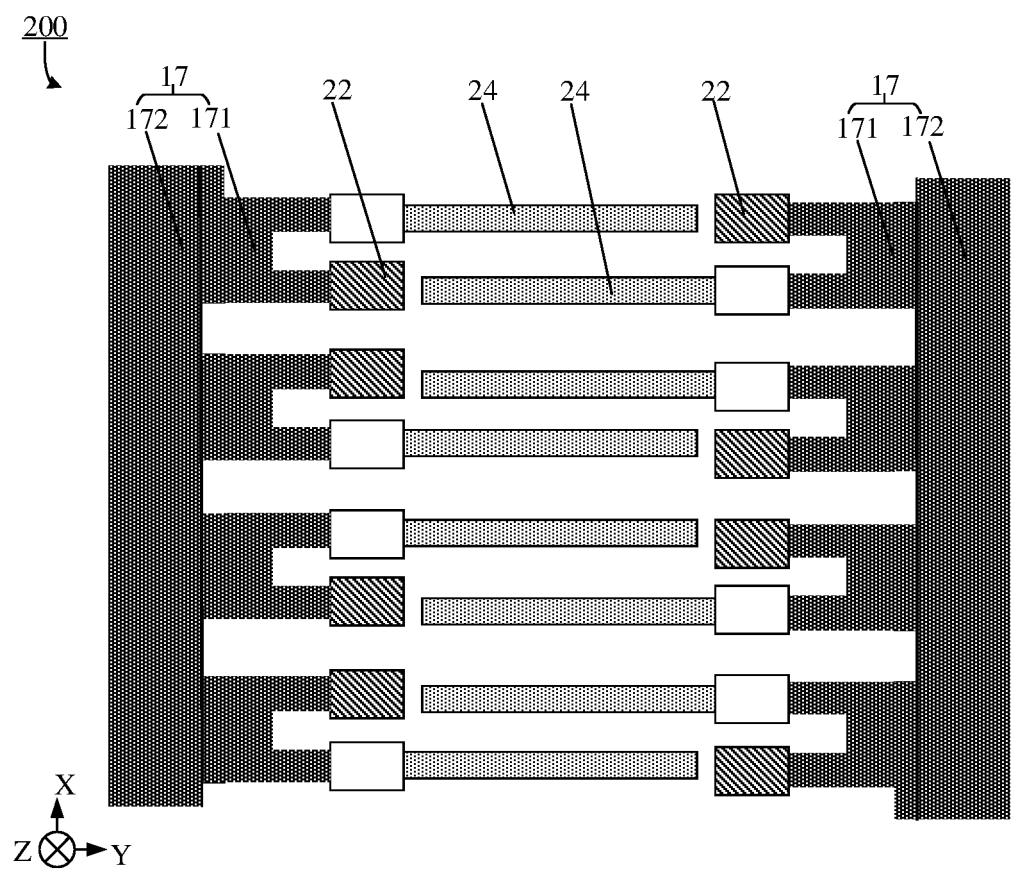

In addition, the embodiments of the disclosure further provide a layout structure. FIG. 6A and FIG. 6B are plane layouts of layout structures provided by embodiments of the disclosure. The layout structure 200 includes: the abovementioned semiconductor structures 100 arranged at intervals in the Y-axis direction.

As shown in FIG. 6A and FIG. 6B, each semiconductor structure 100 includes a plurality of memory cells arranged in an array in the X-axis direction and the Z-axis direction. Each of the memory cells at least includes a first gate structure 171 and a capacitor structure 24. Two adjacent memory cells in the Y-axis direction are centrosymmetric, and the projection regions, in the X-axis direction, of the capacitor structures 24 of the two adjacent memory cells in the Y-axis direction are at least partially overlapped.

In the embodiments of the disclosure, each memory cell further includes a second gate structure 172. The first gate structure 171 and the second gate structure 172 form a comb-shaped gate structure 17.

In some embodiments, continuing to refer to FIG. 6A and FIG. 6B, each semiconductor structure 100 further includes bit line structures 22 and word line stairs 18.

In some embodiments, continuing to refer to FIG. 6A, two adjacent memory cells in the X-axis direction have the same layout.

In some embodiments, continuing to refer to FIG. 6B, two adjacent memory cells in the X-axis direction are axisymmetric.

The layout structure provided by the embodiments of the disclosure can effectively use the space of the semiconductor structures to realize the miniaturization of the semiconductor structure.

In several embodiments provided by the disclosure, it is to be understood that the disclosed device and method may be implemented in a non-target mode. The above described device embodiments are only schematic. For example, the division of the units is only logical function division. In actual implementation, there may be other division modes, for example, a plurality of units or components may be combined, or may be integrated into another system, or some features may be ignored or not implemented.

The characteristics disclosed in several method or device embodiments provided in the disclosure may be freely combined without conflicts to obtain new method embodiments or device embodiments.

The abovementioned descriptions are only some implementation modes of the disclosure, but the scope of protection of the disclosure is not limited thereto. Any variation or replacement readily figured out by a person skilled in the art within the technical scope disclosed in the disclosure shall fall within the scope of the protection of the disclosure. Therefore, the scope of the protection of the disclosure shall be subject to the scope of protection of the claims.

INDUSTRIAL APPLICABILITY

In the embodiments of the disclosure, the comb-shaped gate structures are formed, and a gate metal layer on an outer side of each of the comb-shaped gate structures may serve as a word line of the semiconductor structure, so that through the comb-shaped gate structure, not only the interconnection of the word lines in the same plane of the multi-layer stacked structure can be realized, but also the dimension of the word line can be controlled, so as to reduce a coupling effect between the word line stairs.

The invention claimed is:

1. A method for forming a semiconductor structure, comprising:
providing a substrate, wherein the substrate comprises a first area and a second area arranged in sequence in a second direction, and the first area comprises active layers arranged at intervals in a third direction;
forming an initial gate structure located on a surface of each of the active layers in the first area;
etching the initial gate structures to form comb-shaped gate structures stacked in the third direction, wherein each of the comb-shaped gate structures at least comprises first gate structures arranged at intervals in a first direction, the first direction, the second direction and the third direction are perpendicular to one another, and the first direction and the second direction are parallel to a surface of the substrate; and
forming bit line structures extending in the third direction and capacitor structures extending in the second direction in the second area, wherein each of the bit line structures and each of the capacitor structures are respectively connected to one corresponding first gate structure.

2. The method of claim 1, wherein each of the comb-shaped gate structures further comprises a second gate structure, connected to all the first gate structures located on the same layer.

3. The method of claim 2, wherein a projection of the first gate structure on a surface of the substrate is a U shape.

4. The method of claim 1, wherein the active layers are formed by:
providing a semiconductor substrate;
forming a stacked structure located in the first area and the second area on a surface of the semiconductor structure, wherein the stacked structure comprises first semiconductor layers and second semiconductor layers stacked alternately;
removing the first semiconductor layers in the first area to expose the second semiconductor layers in the first area;
performing thinning processing on the exposed second semiconductor layers to form initial active layers; and
processing the initial active layers to form the active layers.

5. The method of claim 4, wherein processing the initial active layers to form the active layers comprises:
forming a sacrificial layer and a first isolating layer on a surface of each of the initial active layers in sequence, wherein the first isolating layer fills between two adjacent ones of the sacrificial layers;
removing each of the initial active layers with a first length along the second direction to form a first space; and
removing each of the sacrificial layers with a second length along the second direction to expose part of each of the initial active layers and form a second space, wherein the second space comprises the first space, the second length is greater than the first length, and the exposed part of each of the initial active layers forms the active layer.

6. The method of claim 5, wherein forming the initial gate structure located on the surface of each of the active layers in the first area comprises:
forming a gate dielectric layer and a gate conductive layer on a surface of the active layer in sequence, wherein the gate conductive layer fills up the second space.

7. The method of claim 6, after forming the comb-shaped gate structure, the method for forming the semiconductor structure further comprises:
forming word line stairs stacked in sequence in the third direction,
wherein each layer of word lines in the word line stairs is electrically connected to corresponding second gate structures, arranged in the first direction of the comb-shaped gate structure.

8. The method of claim 7, wherein the comb-shaped gate structures are formed by:
simultaneously removing part of the initial gate structures and part of stacked structure in the second area to form L-shaped grooves and isolating grooves arranged alternately in the first direction, and the remaining initial gate structures form the comb-shaped gate structures, wherein a dimension of the isolating grooves in the second direction is greater than a dimension of the L-shaped grooves in the second direction, and each of the active layers is divided into a plurality of active structures arranged in the first direction by the isolating grooves.

9. The method of claim 8, wherein the stacked structures located on two sides in the first direction of the L-shaped groove have different sizes in the second direction; and
forming bit line structures extending in the third direction and capacitor structures extending in the second direction in the second area comprises:
filling an isolating material in the L-shaped grooves and the isolating grooves to form a second isolating layer;
removing the second isolating layer and the first semiconductor layers located in the second area, wherein the remaining second semiconductor layers form first active pillars and second active pillars arranged alternately in the first direction, and each of the first active pillars comprises a first sub-pillar and a second sub-pillar;
forming each of the capacitor structures on a surface of the second sub-pillar; and
forming each of the bit line structures on a surface of the second active pillar.

10. The method of claim 9, further comprising:
forming a supporting layer on a surface of the first sub-pillar before forming the capacitor structures, wherein the supporting layer fills between two adjacent ones of the first sub-pillars.

11. The method of claim 10, wherein forming the capacitor structure on the surface of the second sub-pillar comprises:
forming a first electrode layer, a dielectric layer and a second electrode layer on the surface of the second sub-pillar in sequence to form the capacitor structure.

12. A semiconductor structure, comprising:
a semiconductor substrate, the semiconductor substrate comprising a first area and a second area arranged in sequence in a second direction;
active structures located on a surface of the semiconductor substrate, the active structures being arranged in an array along a first direction and a third direction;
a comb-shaped gate structure, located on a surface of each of the active structures in the first area, and the comb-shaped gate structure at least comprising first gate structures arranged at intervals in the first direction;
bit line structures, extending in the third direction; and
capacitor structures, extending in the second direction,
wherein the bit line structures and the capacitor structures are located on the second area and are connected to the first gate structures, and the first direction, the second direction and the third direction are perpendicular to one another, and the first direction and the second direction are parallel to the surface of the semiconductor substrate.

13. The semiconductor structure of claim 12, wherein the comb-shaped gate structure further comprises: a second gate structure, connected to the first gate structures located on the same layer.

14. The semiconductor structure of claim 13, wherein each of the active structure comprises a first active pillar and a second active pillar located on the second area and arranged in the first direction, and a channel pillar located on the first area; and
the first active pillar and the second active pillar are connected to the channel pillar.

15. The semiconductor structure of claim 14, wherein the first gate structures cover a first surface and a second surface, in the third direction, of the channel pillar; and
each of the first gate structures comprises a gate dielectric layer and a gate conductive layer that are stacked.

16. The semiconductor structure of claim 15, wherein a projection of the channel pillar on the semiconductor substrate is a U shape.

17. The semiconductor structure of claim 14, wherein each of the capacitor structures is located on the first active pillar; and each of the bit line structures is located on the second active pillar; and a L-shaped groove is formed between the first active pillar and the second active pillar of a same active structure.

18. The semiconductor structure of claim 17, wherein an isolating groove is formed between two adjacent ones of the active structures in the first direction; and a dimension of the isolating groove in the second direction is greater than a dimension of the L-shaped groove in the second direction.

19. The semiconductor structure of claim 13, further comprising: word line stairs, wherein the word line stairs are stacked in sequence in the third direction; and each layer of word lines in the word line stairs are connected to a plurality of second gate structures, arranged in the first direction, of the comb-shaped gate structure.

20. A layout structure, comprising the semiconductor structures of claim 12 arranged at intervals in the second direction, wherein each of the semiconductor structure comprises memory cells arranged in an array in the first direction and the third direction, wherein each of the memory cells comprises a first gate structure and a capacitor structure; and two adjacent ones of the memory cells are centrosymmetric in the second direction, and projection regions of the capacitor structures of the two adjacent memory cells in the second direction are at least partially overlapped in the first direction, wherein two adjacent ones of the memory cells in the first direction have a same outlay or are axisymmetric.

* * * * *